US010098478B2

(12) United States Patent
Miller, Jr. et al.

(10) Patent No.: US 10,098,478 B2
(45) **Date of Patent: *Oct. 16, 2018**

(54) PRODUCT MERCHANDISING SYSTEM

(71) Applicant: Presence from Innovation, LLC, Hazelwood, MO (US)

(72) Inventors: Donald J. Miller, Jr., Belleville, IL (US); Andrew J. Boron, Belleville, IL (US); Kent Lee Hanners, St. Charles, MO (US)

(73) Assignee: Presence from Innovation, LLC, St. Louis, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/827,895

(22) Filed: Nov. 30, 2017

(65) Prior Publication Data

US 2018/0078054 A1 Mar. 22, 2018

Related U.S. Application Data

(63) Continuation of application No. 14/305,486, filed on Jun. 16, 2014, now Pat. No. 9,861,211.

(51) Int. Cl.

| | |
|---|---|
| ***A47F 1/12*** | (2006.01) |
| ***G09F 3/20*** | (2006.01) |
| ***A47F 5/00*** | (2006.01) |

(52) U.S. Cl.

CPC ................ *A47F 1/12* (2013.01); *A47F 5/005* (2013.01); *G09F 3/204* (2013.01); *H05K 999/99* (2013.01)

(58) Field of Classification Search

CPC .......... A47F 5/005; A47F 5/0043; A47F 1/12; A47F 1/126; A47F 1/125; A47F 7/28; G09F 3/204; B65G 1/023; H05K 999/99

USPC ........................................ 211/59.2, 59.3, 184

See application file for complete search history.

(56) References Cited

U.S. PATENT DOCUMENTS

| | | |
|---|---|---|
| 3,501,019 A | 3/1970 | Armstrong et al. |
| 3,872,976 A | 3/1975 | Moore et al. |
| 3,954,184 A | 5/1976 | Mendenhall |
| 4,181,229 A | 1/1980 | Moore |
| 4,460,096 A | 7/1984 | Ricci |
| 4,478,337 A | 10/1984 | Flum |
| 4,538,737 A | 9/1985 | Delaney |

(Continued)

FOREIGN PATENT DOCUMENTS

| | | |
|---|---|---|
| JP | 2000316680 A | 11/2000 |
| WO | 99/30597 A1 | 6/1999 |

*Primary Examiner* — Patrick D Hawn

(74) *Attorney, Agent, or Firm* — Husch Blackwell LLP

(57) ABSTRACT

A variable shelf organizer system for displaying merchandise thereon including a roller glide floor member, a standard track glide floor member, a plurality of removably adjustable divider members and a front wall member. The divider members and front wall member are engageable with both floor members and when multiple divider members are engaged with either floor member, product channels are formed therebetween for holding and securing products of varying size and shape on either floor member. The roller glide floor member is best suited for heavier packaged products such as six-pack or twelve pack products and the track glide floor member is best suited for standard products. The width of the shelf system may be increased or decreased by joining or detaching similarly constructed floor members in a side-by-side relationship and the length of the shelf system may be increased by attaching one or more floor extension members to the floor members.

22 Claims, 15 Drawing Sheets

(56) References Cited

U.S. PATENT DOCUMENTS

| | | | |
|---|---|---|---|
| 4,651,883 | A | 3/1987 | Gullett et al. |
| 4,712,694 | A | 12/1987 | Breslow |
| 4,768,661 | A | 9/1988 | Pfeifer |
| 4,785,945 | A | 11/1988 | Rowse et al. |
| 4,858,774 | A | 8/1989 | Winter et al. |
| 4,997,094 | A | 3/1991 | Spamer et al. |
| 5,088,607 | A | 2/1992 | Risafi et al. |
| 5,199,584 | A | 4/1993 | Fowler et al. |
| 5,255,802 | A | 10/1993 | Krinke et al. |
| 5,265,738 | A | 11/1993 | Yablans et al. |
| 5,458,248 | A | 10/1995 | Alain |
| 5,624,042 | A | 4/1997 | Flum et al. |
| 5,634,564 | A | 6/1997 | Spamer et al. |
| 5,673,801 | A | 10/1997 | Markson |
| 5,685,664 | A | 11/1997 | Parham et al. |
| 5,695,077 | A | 12/1997 | Jay |
| 5,709,158 | A | 1/1998 | Wareheim |
| 5,788,090 | A | 8/1998 | Kajiwara |
| 5,884,782 | A | 3/1999 | Dembicks |
| 5,904,256 | A | 5/1999 | Jay |
| 6,082,557 | A | 7/2000 | Leahy |
| 6,089,385 | A | 7/2000 | Nozawa |
| 6,098,821 | A | 8/2000 | Dube et al. |
| 6,142,316 | A | 11/2000 | Harbour et al. |
| 6,234,328 | B1 | 5/2001 | Mason |
| D450,726 | S | 11/2001 | Menz |
| 6,409,026 | B2 | 6/2002 | Watanabe |
| D459,738 | S | 7/2002 | Menz |
| 6,419,100 | B1 | 7/2002 | Menz et al. |
| 6,484,891 | B2 | 11/2002 | Burke |
| 6,497,326 | B1 | 12/2002 | Osawa |
| 6,523,664 | B2 | 2/2003 | Shaw et al. |
| 6,523,702 | B1 | 2/2003 | Primiano et al. |
| 6,523,703 | B1 | 2/2003 | Robertson |
| 6,615,995 | B2 | 9/2003 | Primiano et al. |
| 6,637,604 | B1 | 10/2003 | Jay |
| 6,874,646 | B2 | 4/2005 | Jay |
| 6,955,269 | B2 | 10/2005 | Menz |
| 6,962,260 | B2 | 11/2005 | Jay et al. |
| 7,063,217 | B2 | 6/2006 | Burke |
| 7,083,054 | B2 | 8/2006 | Squitieri |
| 7,114,606 | B2 | 10/2006 | Shaw et al. |
| 7,182,209 | B2 | 2/2007 | Squitieri |
| 7,200,903 | B2 | 4/2007 | Shaw et al. |
| 7,395,938 | B2 | 7/2008 | Merit et al. |
| D611,743 | S | 3/2010 | Mitten et al. |
| 8,016,139 | B2 | 9/2011 | Hanners et al. |
| 9,277,831 | B2 | 3/2016 | Hardy |
| 2003/0010737 | A1 | 1/2003 | Lee |
| 2003/0132178 | A1 | 7/2003 | Jay et al. |
| 2005/0133471 | A1 | 6/2005 | Squitieri |
| 2007/0175844 | A1 | 8/2007 | Schneider |
| 2010/0133214 | A1 | 6/2010 | Evans |
| 2010/0252519 | A1 | 10/2010 | Hanners et al. |

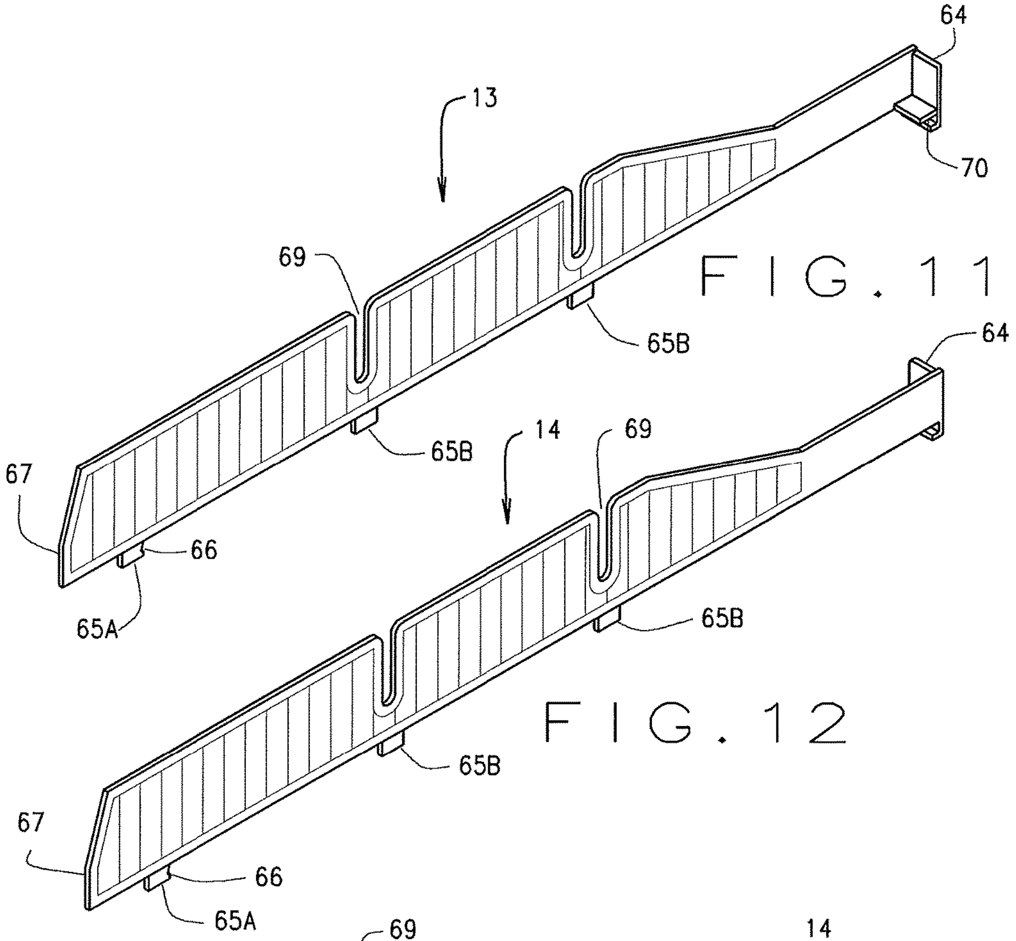
FIG. 11
FIG. 12
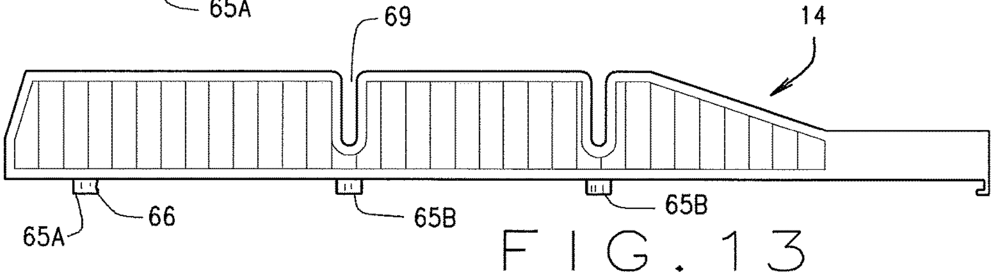
FIG. 13
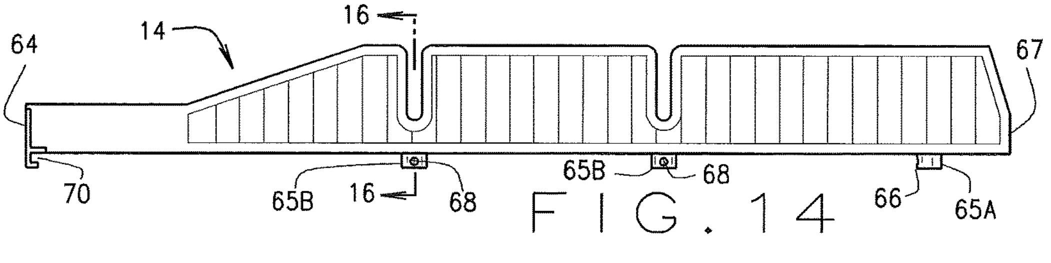
FIG. 14

PRODUCT MERCHANDISING SYSTEM

CROSS REFERENCE TO RELATED APPLICATION

This application is a continuation of U.S. patent application Ser. No. 14/305,486, which was filed on Jun. 16, 2014, titled "PRODUCT MERCHANDISING SYSTEM." The entire disclosure of this application is incorporated herein by reference.

BACKGROUND OF INVENTION

The present invention relates generally to two embodiments of a gravity feed shelf organizer system for use in a wide variety of product merchandising display units including refrigerated display coolers commonly employed by supermarkets, convenience stores, and other wholesale and retail outlets and, more particularly, to various embodiments of a floor member and associated divider members and front wall member which are capable of being assembled so as to accommodate most shelf widths and any size and shape of product including heavier packaged products. The shelf system includes divider members engageable with the various embodiments of the floor member which can be selectively positioned and adjusted to form product guide channels of varying width to accommodate products of varying sizes and shapes, and it includes a front wall member which is likewise engageable with the various embodiments of the floor member and acts as a momentum arrestor to prevent product from toppling over the front wall of the shelf system. The present shelf system can be conveniently supported in a flat horizontal position or in an inclined position for gravity feeding products positioned thereon and represents a one-inventory solution to a particular user's specific needs and applications.

One problem that is typically associated with storing and displaying shelved products in a gravity feed shelf is the difficulty that heavier packaged products have in sliding down the shelf when the product is either being stocked, or when a consumer selects from the shelf a front product and other rear products are to slide down the shelf to replace the selected front product. For example, packaged products such as a six-pack or twelve-pack of beer or soda may have trouble sliding down the shelf to be at the front of the shelf, the position where consumers could more easily select the packaged product from the shelf.

Another problem typically associated with storing and displaying shelved products for sale to customers in a retail store setting is the inefficient use of available shelf space and the inability of the merchant to constantly provide an attractive arrangement of shelved products which are readily visible and easily accessible to the customer. Typically, articles of merchandise, especially products such as numerous bottled and canned soft drink products which are packaged in a wide variety of different container sizes and shapes, are randomly distributed and stacked in segregated areas on a shelf or other display device in such a manner that the selection of a particular item, access to that particular item, and the removability of that item from the shelf or display device by the customer becomes, at times, difficult if not impossible. In the present day marketing of consumer products, it is important to maintain the display of products in a suitable and organized fashion.

As a result, a wide variety of display devices and shelf organizers have been designed and manufactured for use in merchandising shelved products to consumers, and such devices are commonly utilized by supermarkets, convenience stores, grocery outlets, fast food outlets, and a wide variety of other wholesale and retail stores to show and focus attention on the particular products displayed therein. Although various shelf organizer constructions are known and have been utilized to alleviate some of the aforementioned problems associated with merchandising shelved products to customers, the known devices generally have limitations. For example, the known shelf organizers often fail to facilitate the movement of heavier product down the shelf. The known devices also have limitations in their ability to be compatible with shelves of varying width and length and, more importantly, they likewise have limitations in their ability to easily and quickly adjust the segregated product channels associated therewith to accommodate products of varying shapes and sizes so that a wider variety of different products may be stocked and dispensed from the same units.

SUMMARY OF INVENTION

The present invention relates to a product merchandising system or shelf organizer system designed to display merchandising products, the present system being assembled to accommodate a plurality of shelf widths and in one embodiment a plurality of shelf lengths, and thus a variety of product dimensions. The invention includes two floor member embodiments which function as one merchandising system to accommodate products of varying sizes and shapes, with the present merchandising system acting as shelf organizing units wherein merchandising products such as individual bottles or cans, as well as packaged bottles or cans (e.g., six, twelve, twenty, twenty-four, or thirty packages of water, soft drinks, beer, or other refreshments) may be stocked, dispensed, and re-stocked as needed. Both embodiments of the shelf organizing system are adaptable for use in refrigerated display coolers and other shelving arrangements commonly employed by supermarkets, convenience stores, and other wholesale and retail outlets.

The shelf organizing system described herein generally includes one or more floor members, a plurality of divider members, and a front wall member, wherein a plurality of organizing systems may be adjacently engaged with one another to form a shelf of most desired widths. In both shelf organizing system embodiments described herein, the floor members serve to support the product and facilitate its movement in a gravity feed orientation as other product is selected from the shelf or as the shelf is stocked. The divider members serve to define product channels wherein product of varying sizes and shapes is contained therein and separated from other product. The front wall member acts as a momentum arrestor for preventing product from toppling over the front wall associated with the supporting floor member and also minimizes scratches so that product can be clearly seen through the clear or transparent front wall member. The front wall member further serves as well as a means for displaying important product information such as price and/or quantity. The two shelf glide embodiments—roller and standard—are broadly described in this Summary and are described in greater detail in the Detailed Description of the invention that follows.

The first shelf organizing system, a shelf roller glide system, includes a plurality of cooperatively engageable floor members. The floor members of the roller glide system include a plurality of grid-like roller sections that make up the floor portion of the floor members, wherein each roller section includes a plurality of rollers. The rollers facilitate the movement of heavier product that may have difficulty sliding on a conventional shelf system otherwise due to the product's heavier weight and lower inertia. In the transverse direction perpendicular to the motion of the rollers that move the product along the floor member, each floor member further includes a plurality of rows of spaced-apart slots formed by a plurality of spaced apart rib members for cooperatively receiving cooperative means on any one of a plurality of divider members, wherein the slots extend transversely across the entire width of a single floor member at pre-determined spaced locations.

The floor members further include an upward extending, built-in front product bumper, the bumper including a plurality of cavities for receiving a plurality of engaging nubs or flange portions associated with the bottom portion of a front wall member so as to selectively engage the front wall member to the front product bumper such that the wall member extends upwardly from the front product bumper.

Each product supporting floor member also includes a joinder mechanism enabling a plurality of similarly constructed floor members to be cooperatively engaged side-by-side with one another so as to form a shelf organizer unit of any particular shelf width. The floor members of the roller glide system include a plurality of L-shaped hooks positioned and located on one side of the respective floor members for mating with and engaging a plurality of respective gaps or openings located on the opposite side of the floor members. Therefore, to connect a series of floor members in order to generate a shelf of a specified width, the L-shaped hooks of one floor member are selectively engaged with the corresponding openings or gaps associated with an adjacent floor member. This connection can be repeated in series for each adjacent floor member until the desired shelf width is achieved. The individual floor members can be made of varying widths so that the appropriate width floor members may be joined together to achieve a particular overall shelf width. It is also recognized that the width of any floor member can likewise be reduced by removing various floor members.

In the shelf roller glide system embodiment, the shelf length may also be adjusted. In that embodiment, the floor member may further be selectively engaged to a floor extension member connected to the rear terminal end portion of each floor member. The floor extension member, like the floor member, includes a plurality of roller sections, wherein each section includes a plurality of rollers to help facilitate product movement. Each floor extension member, like the individual floor members, includes at least one row of transverse slots for being selectively engageable with corresponding means associated with the divider members. In a substantially similar arrangement to that of the floor members, the floor extension member further includes a plurality of L-shaped hooks on one side of the floor extension member and its opposite side similarly includes corresponding openings or gaps opposite its L-shaped hooks, the openings or gaps being similarly sized and positioned to mate with the L-shaped hooks of adjacent floor extension members to increase shelf width.

The floor member and floor extension member of the present invention are selectively engaged in a process described herein. The floor member of the roller glide shelf includes a plurality of slots or receivers which are located along a rear, terminal end portion of the floor member for engaging a plurality of finger members associated with one end portion of the floor extension member, the finger members being positioned and located to be selectively engageable with the plurality of slots or receivers of the floor member. When the finger members and receivers are selectively engaged, in a process described in detail below, the floor member and floor extension member form a continuous, level surface. The opposite or rear end portion of the floor extension member may also include a plurality of slots or receivers located along its rear end terminal portion for engaging the plurality of finger members associated with another floor extension member. Any number of floor extension members can be coupled together with a particular floor member to achieve a desired length.

The means by which the individual floor members engage a divider member includes the plurality of transverse slots associated with the floor members and floor extension members. The transverse row of slots formed by a plurality of rib members located at the front most portion of the floor member includes a ridge that extends transversely across the floor member, the ridge projecting from a back surface of the first row of slots. The remaining transverse rows of slots associated with the floor members and the floor extension members are also formed by a plurality of parallel rib members, each rib member further including at least one transverse projection.

Each divider member includes a plurality of downwardly extending spaced apart tabs. The front tab which is positioned and spaced on the divider member so as to overlay and engage the front most transverse row of slots includes a barb or node for association with the ridge extending transversely across the floor member in the front most transverse row of slots. The remaining tabs include at least one recess or a hole. These tabs are positioned and spaced along the length of a divider member so as to overlay and engage one of the transverse slots associated with one of the remaining transverse rows of slots. When so engaged, the recess or hole of each tab engages a projection associated with one of the rib members forming the remaining transverse rows of slots. The node of the first tab, and the recesses or holes of the remaining tabs on the divider members may be selectively engageable with the ridge and with the at least one projection associated with one of the rib members from a particular transverse slot, respectively, so as to selectively engage the divider member to the floor member in a generally perpendicular manner. The selective placement of the divider members allows the shelf roller glide system to form any number of segregated product guide channels for arranging products therebetween by simply engaging any number of divider members with a floor member. The width of each product guide channel is selectively adjustable by engaging the respective divider members forming such product guide channels in different transverse slots associated with the transverse rows of slots, thereby varying the distance between any two adjacent divider members.

The at least one transverse row of slots associated with the floor extension member similarly includes a plurality of rib members, wherein each rib member further includes at least one projection for selective engagement with an at least one tab recess or hole of the divider member. When the floor extension member is engaged with the floor member, a longer divider member is needed to ensure that the product guide channels extend throughout the entire length of the floor member and the floor extension member as connected.

The present divider members also include a rear product stop bumper. The rear product stop bumper includes a C-shaped channel portion for engaging the rear, terminal end portion of each floor member. Alternatively, if the floor member was connected with a floor extension member in the process described above, the divider member would be longer, and its C-shaped channel portion would engage the rear, terminal end portion of the floor extension member. This engagement, along with the engagement of the divider member tabs with the transverse slots in the floor member and floor extension member secures the divider member to the floor member and/or the floor extension member. Disengagement of the divider members from the floor member and the floor extension member is easily accomplished in reverse fashion and the divider members and floor extension member may be easily disengaged and re-engaged with the floor member to accommodate any size product.

The floor member further includes a front product bumper which acts as a momentum arrestor means for stabilizing the forward-most product container, preventing merchandise from toppling over the front of the floor member. The front product bumper includes a plurality of upwardly extending slots formed by rib members associated with its back surface. The upwardly extending slots act as receivers to engage the front portion of a divider member to further secure the divider members to the floor member. When fully engaged, a divider member will be engaged with the front product bumper, with the plurality of transverse slots in the transverse row of slots associated with the floor member and/or floor extension member, and with the rear of the floor member or floor extension member via the C-shaped channel portion of the divider member.

Preventing taller products from toppling over the front product bumper is further supported by use of the front wall member. The front wall member is selectively engaged with the front product bumper so as to extend in a generally upwards direction from the front bumper. The front product bumper includes a plurality of cavities located in its top portion and extending downwardly therefrom. The cavities are positioned and located to receive nubs or flanges associated with the front wall member. The cavities selectively engage the flanges, and in doing so, secure the front wall member to the front product bumper. The front wall member, because it extends upwards from the product bumper, provides further support to ensure that taller products do not topple over the bumper. The front wall member may be made in a plurality of heights so as to prevent a range of products with differing heights from toppling over the bumper. In the present embodiment, the front wall member is curved such that the front product in each product channel makes initial contact with the upper portion of the front wall member as it rolls down the gravity feed floor member, thus aiding in preventing the front product from toppling over the wall member if the product were instead to make initial contact with a lower portion of the wall member, or with the front product bumper. The front wall member may also be angularly shaped to achieve this same desired result. The front wall member, when associated with the front product bumper, also forms a graphic panel channel wherein product signage to advertise the product as well as its price and/or quantity may be inserted and/or removed therefrom.

The second embodiment of the present shelf organizer system disclosed herein includes a standard shelf glide floor member with many of the inventive concepts discussed above. Like the roller shelf glide system described above, the standard shelf glide system generally includes one or more floor members, the same plurality of divider members, and the same front wall member. Furthermore, the standard shelf glide system functions similarly to the roller glide system in that it likewise provides a means for stocking and re-stocking merchandising products wherein the product channels may be easily and quickly adjusted to contain a range of product sizes, and the products are moved in a gravity feed fashion. As before, a plurality of standard glide floor members may be engaged side-by-side with one another in order to form a shelf of almost any desired width.

The standard glide system includes floor members that do not include roller sections, or rollers. Instead these floor members are made up of a grid-like surface with a plurality of track members, the track members being shaped and configured to reduce surface area and friction in order to guide products along the gravity feed surface. The slots or openings formed between the track members allow cool air to freely circulate around the products positioned on the floor member. The standard glide floor member similarly includes a plurality of transverse rows of a plurality of transverse slots formed by a plurality of rib members, as in the roller glide embodiment. In the standard glide floor member, the first slot row includes a ridge to selectively engage the node of the front most tab on a divider member, and the rib members in the remaining rows of slots also include transverse projections positioned and located to selectively engage the recesses or holes associated with the remaining tab members of the divider member. Unlike the roller glide floor member, the standard glide floor member does not include a floor extension member that may be used to increase shelf length but the standard glide floor member can be made in a multitude of lengths to accommodate a particular application.

The standard glide embodiment also differs from the roller glide embodiment in that the means by which the adjacent floor members selectively engage one another in order to increase the shelf width are slightly different as will be hereinafter explained. On the other hand, the means by which the divider members and front wall members attach to and detach from the floor member of the standard glide embodiment is substantially similar to the means by which the divider members and front wall members attach to and detach from the floor member of the roller glide embodiment. In this regard, the same divider members and front wall member can be used with both the roller glide embodiment and the standard glide embodiment of the present invention.

Like the floor member of the roller glide embodiment, the floor member of the standard glide embodiment likewise includes the built-in front product bumper. However, in the standard glide embodiment, each front product bumper further includes at least one T-shaped boss or projection located on one side of the front product bumper and at least one T-shaped slot located on the opposite side of the front product bumper. The T-shaped slot is positioned and located to selectively engage the T-shaped boss or projection of an adjacent floor member when the floor members are positioned adjacent one another so as to extend shelf width.

Because of the construction of the floor members and divider members of both glide system embodiments, once the present floor members are coupled together in side-by-side relationship to form an overall shelf floor, the same individual divider members described for use in the roller glide embodiment may be selectively positioned within any slot of a transverse row of slots, even a slot existing between two coupled floor members, each respective pair of divider members defining therebetween a product guide channel for supporting and guiding products positioned therebetween in parallel rows. This construction enables a merchant to easily segregate any or all of the floor members into a plurality of parallel guide channels for supporting and guiding products positioned therebetween, each guide channel being selectively adjustable to accommodate any product width. The same is true with respect to using the same front wall member with the standard glide floor member. The front product bumper on the standard glide floor member includes a plurality of cavities which are substantially identical to the cavities of the front product bumper of the roller glide floor member and the front wall member engages the front product bumper of the standard glide floor member in a similar manner.

BRIEF DESCRIPTION OF DRAWINGS

FIG. 11 illustrates a perspective view of a right-facing divider member of the shelf roller glide system of FIGS. 1 and 2 constructed according to the teachings of the present invention.

FIG. 12 illustrates a perspective view of a left-facing divider member of the shelf roller glide system of FIGS. 1 and 2 constructed according to the teachings of the present invention.

FIG. 13 illustrates a right side elevation view of the left-facing divider member of FIG. 12.

FIG. 14 illustrates a left side elevation view of the left-facing divider member of FIG. 12.

DETAILED DESCRIPTION

Figure 1:
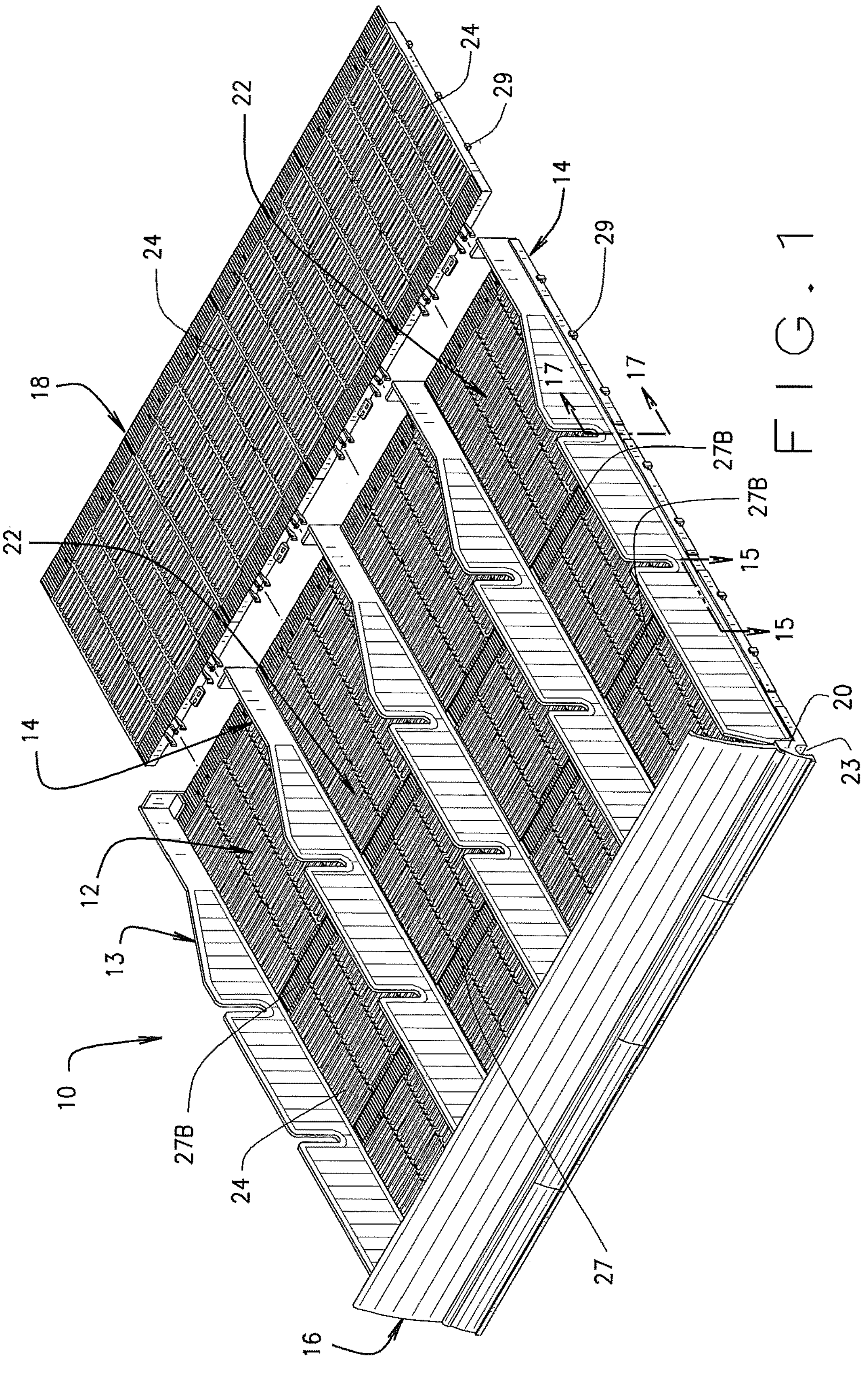
FIG. 1 illustrates a perspective view of one embodiment of a shelf roller glide system and a floor extension member extended therefrom, the shelf roller glide system constructed and assembled according to the teachings of the present invention.

Referring to the drawings more particularly by reference numbers, wherein like numerals refer to like parts, the number 10 in FIG. 1 identifies a shelf organizer gravity feed roller glide system constructed according to the teachings of the present invention. The roller glide system 10 includes one or more cooperatively engageable roller glide floor members 12, a right-facing divider member 13, left-facing divider members 14, any plurality of divider members 13 and 14 positioned therebetween, and a front wall member 16. The various roller glide floor members 12 can be made of a different width to accommodate a wide variety of different overall shelf widths depending upon the particular application. FIG. 1 further illustrates a floor extension member 18 shown in an exploded orientation from the roller glide system 10 which may be selectively engaged with the floor member 12 to increase the length of the overall shelf in a process described herein. The roller glide system 10 acts as a gravity feed shelf for stocking, dispensing, and re-stocking merchandising product such as individual bottles or cans, as well as packaged bottles and cans such as six, twelve, twenty, twenty-four, or thirty packages of water, soft drinks, juices, beer, or other refreshments.

In the stocking process, merchandising product is typically stocked at the rear of the roller glide system 10, although often times, because of convenience, product is also re-stocked from the front of the unit. The product slides along the floor member 12 generally toward the front wall member 16 and/or the front product bumper 20 that is built into the floor member 12. The divider members 13 and/or 14 are selectively engageable with the floor member 12 to form product channels 22 wherein merchandise product may be contained separately from other merchandise product contained in adjacent, parallel product channels 22. Because the divider members 13 and/or 14 may be engaged in a plurality of different locations along the transverse portion of the floor members 12, a plurality of product channel widths 22 may be formed so as to accommodate a variety of merchandise product shapes and sizes. The means by which floor members 12 receive and engage divider members 13 and/or 14 is explained in detail hereinbelow.

The front wall member 16 is selectively engageable with the front product bumper 20 and both members 16 and 20 act as momentum arrestor means to prevent merchandising product from toppling over the front wall member 16 where the product could be damaged. The front product bumper 20 may be secured to a cylindrical bar or other support rod or member (not illustrated) that is built into a shelf support structure already existing in a cooler or other display rack located at a convenience store or similar retail outlet in a manner well known in the art. A rounded arch 23 that extends transversely across the bottom portion of the front product bumper 20 may selectively mate with the aforementioned cylindrical bar or rod and thus secure the front product bumper 20 and consequently the roller glide system 10 to an existing shelf support system.

In order to accommodate varying product shapes and sizes, or to accommodate various sizes of existing shelving units in a store or other retail outlet, it may be necessary to lengthen the floor member 12. The present invention is capable of such an adjustment to shelf length through the use of floor extension member 18. Floor extension members 18 may be selectively engaged with the rear portion of the floor members 12, and with each other, to form a continuous, level surface, thus allowing product to effectively slide on an extended gravity feed floor member of the roller glide system 10. Notably, when the floor extension member 18 is engaged with the floor member 12, a longer divider member other than divider members 13 and 14 disclosed herein may be required for attachment to ensure the appropriate length of the product channel 22 to fully contain product and keep it separate from product in adjacent product channels 22.

Figure 9:
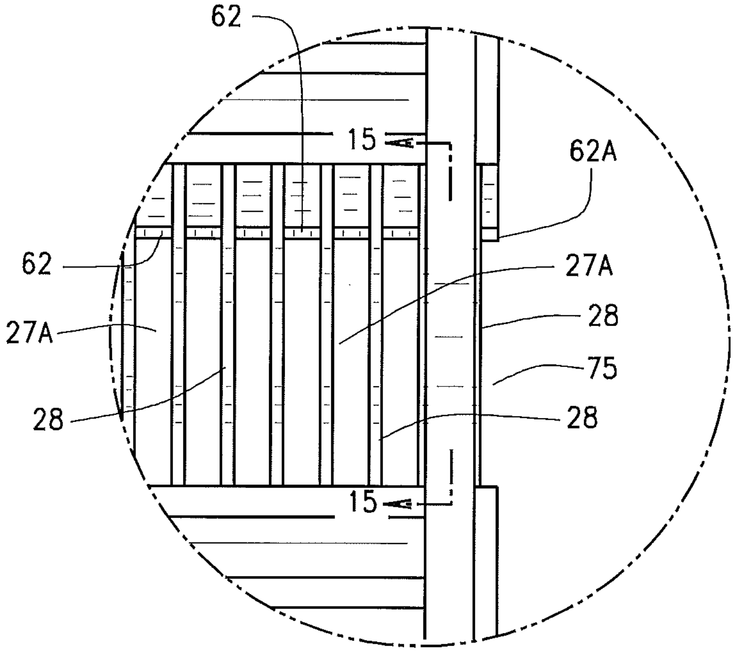
FIG. 9 illustrates an enlarged top plan view of a front row of transverse slots as indicated in FIG. 8.
Figure 10:
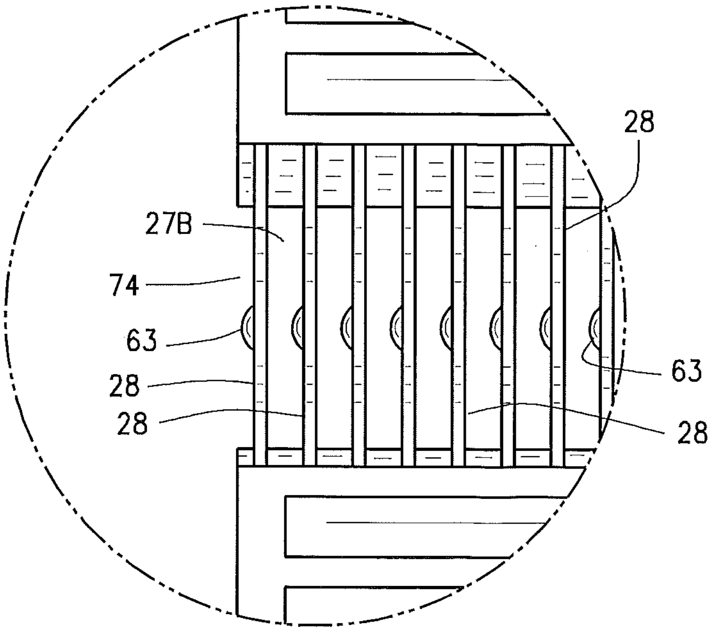
FIG. 10 illustrates an enlarged top plan view of a rear row of transverse slots as indicated in FIG. 8.

Floor members 12 include a plurality of roller sections 24 that extend transversely across the floor member 12. The roller sections 24 are formed by pockets within the floor member 12 that contain and secure a plurality of rollers within each respective section 24 in a method well-known in the art. The rollers facilitate movement of a product along the floor member and are particularly useful in moving heavier products that may require assistance in addition to gravity to slide along the floor member 12 in a gravity feed orientation. The rollers rotate to move product toward the front bumper 20. The roller sections 24 are separated from one another by a plurality of rows of transverse slots 27, the slots 27 being formed by a plurality of spaced-apart rib members 28 as best illustrated in FIGS. 9 and 10 that extend transversely across the floor member 12. In the embodiment illustrated in FIGS. 1, 2 and 8, the roller glide system 10 includes three rows of transverse slots 27 when the floor member 12 is not secured to the floor extension member 18.

Figure 19:
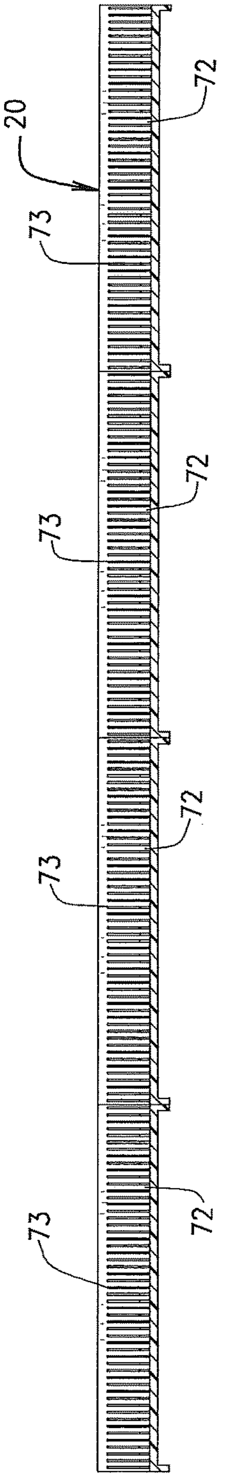
FIG. 19 illustrates a rear elevation cross-section view of the front product bumper taken along line 19-19 of FIG. 8.

The floor members 12 also include a landing zone 35 located at the front of the floor member between the front product bumper 20 and the front row of transverse slots 27A as well as the front roller sections 24 so as to protect the front roller sections from damage when loading the floor member 12 from the front. Front loading typically involves a repeated force being applied to the front portion of the floor member and moving or pushing the front product and all successive products behind it rearward so as to make room for the upfront product. This repeated impact from loading product onto the front portion of the floor member creates the potential to damage the front rollers 24 if they were to extend all the way to the front product bumper 20. Instead, the landing zone 35 absorbs all of this wear and tear on the front portion of the floor member 12 caused by the front loading process and protects the front roller sections 24 from damage since they are offset from the front product bumper 20. As shown in FIG. 19, the bottom portion of the landing zone 35 is solid thereby providing more strength to the landing zone.

Figure 2:
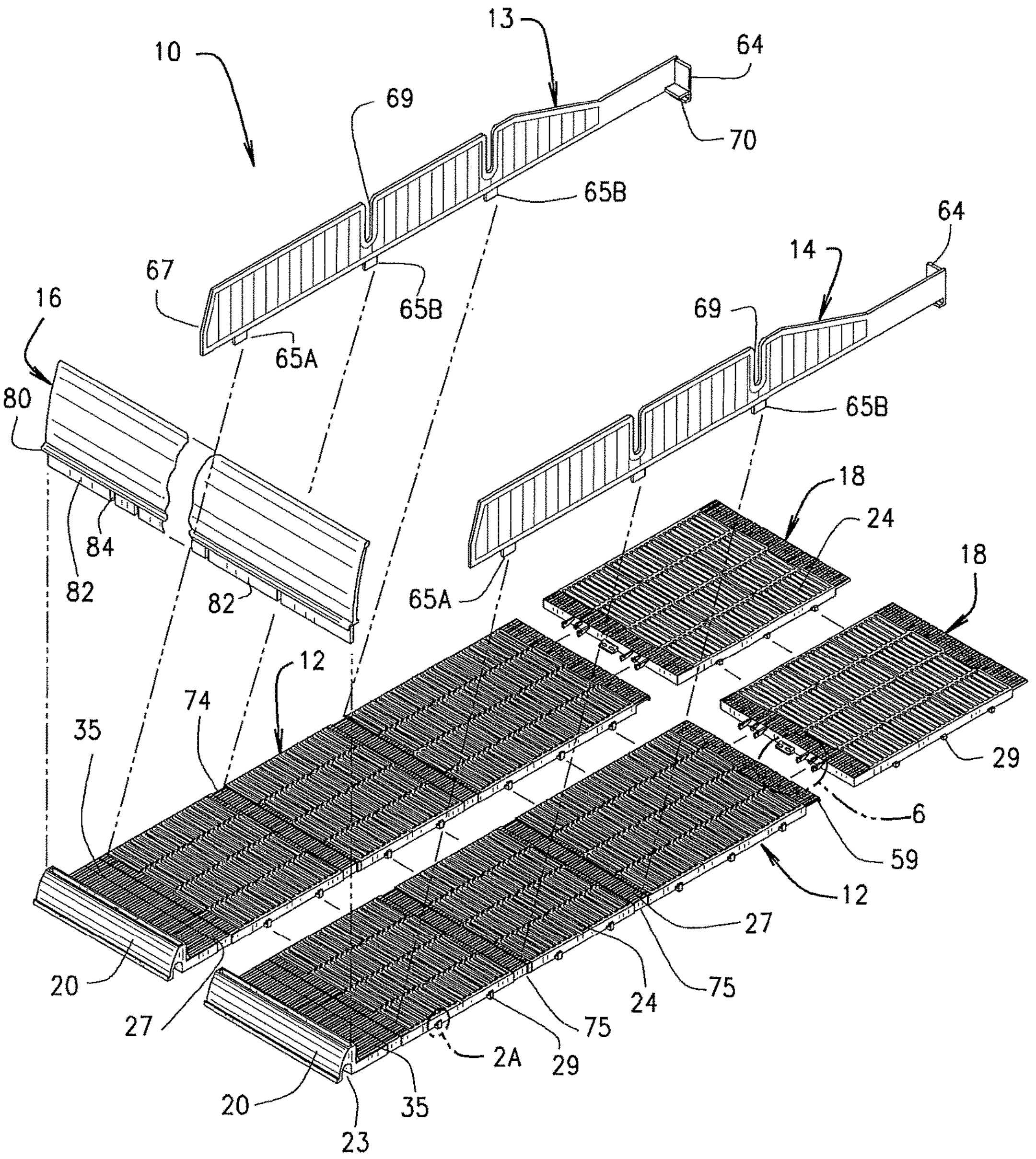
FIG. 2 illustrates an exploded view of the shelf roller glide system and floor extension member of FIG. 1.

In order to generate a wider shelf for the roller glide system 10 to accommodate more product and more product channels 22, floor members 12 may be selectively engaged with one another in a side-to-side configuration. FIG. 2 illustrates an exploded view of the roller glide system 10 including a plurality of floor members 12, divider members 13 and 14, front wall members 16, and floor extension members 18. The means by which floor members 12 may be joined to one another, the means by which floor members 12 may be joined to floor extension members 18, and the means by which floor extension members 18 may be joined with one another are illustrated in FIGS. 2, 2A, 2B, 3, 6, 7A and 7B and will be hereinafter further discussed.

Figure 2A:
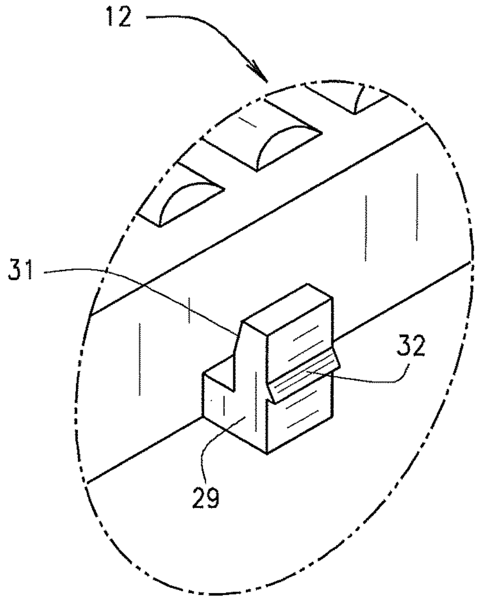
FIG. 2A illustrates an enlarged perspective view of an L-shaped hook of the floor member of FIGS. 1 and 2.
Figure 2B:
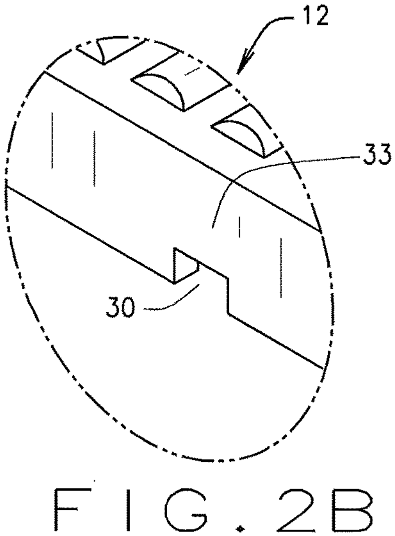
FIG. 2B illustrates an enlarged perspective view of a gap or opening of the floor member of FIGS. 1 and 2 for mating with the L-shaped hook of FIG. 2A.

The floor members 12 include on one side thereof a plurality of upwardly extending, spaced apart, L-shaped hooks 29 as best illustrated in FIG. 2A. On the side opposite of the L-shaped hooks 29, the floor members 12 further include a plurality of spaced apart gaps or openings 30 as best illustrated in FIG. 2B, the L-shaped hooks 29 and gaps 30 of adjacent floor members 12 being positioned and located to selectively mate with one another. An enlarged perspective view of the L-shaped hook 29 is illustrated in FIG. 2A, and an enlarged perspective view of the gap 30 is illustrated in FIG. 2B. In the embodiment illustrated in FIGS. 1, 2 and 8, floor members 12 include seven L-shaped hooks 29 and gaps 30 for selective mating, although any plurality of L-shaped hooks 29 and gaps 30 are alternatively envisioned and may be used depending upon the overall size and shape of each respective floor member 12. The L-shaped hook 29 also includes a barb 32.

Figure 3:
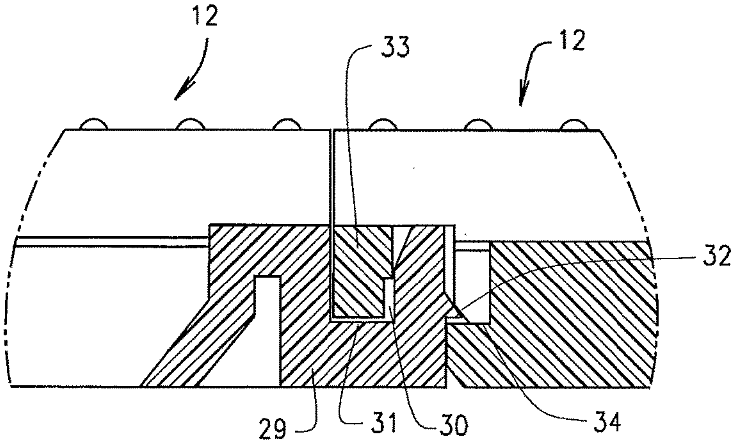
FIG. 3 illustrates a cross-section view of the engagement between the L-shaped hook of FIG. 2A and the gap of FIG. 2B taken along lines 3-3 of FIG. 8.

FIG. 3 illustrates a cross-section view of the engagement of an L-shaped hook 29 with a corresponding gap 30 between adjacent floor members 12. To engage two adjacent floor members 12 in a side-by-side relationship to increase shelf width, L-shaped hook 29 is inserted into the adjacent gap 30 of an adjacent floor member 12. A base portion of the L-shaped hook 29 mates with the gap 30 such that the sides of the adjacent floor members 12 are flush with one another. The L-shaped hook 29 includes a space 31 formed by L-shaped hook configuration and this space mates with floor portion 33 located above gap 30. Floor portion 33 fits inside space 31 as best illustrated in FIG. 3 and is removably secured within the gap 30 when the barb 32 engages a ledge 34 associated with the floor member structure forming gap 30. Floor portion 33 prevents an adjacent floor member 12 from being moved upward and barb 32 prevents the adjacent floor member 12 from being moved downward.

In order to disengage two adjacent floor members 12, the floor member 12 including the L-shaped hook 29 should be pushed downward and/or sideways or outward to disengage the barb 32 of the L-shaped hook 29 from the ledge 34 of the corresponding gap 30. Then, after the L-shaped hook 29 is pulled outward and away from the gap 30, the adjacent floor members 12 can be pulled apart from one another. If the floor members 12 of the roller glide system 10 further include floor extension members 18 attached in a manner described hereinbelow, the floor extension members 18 are engaged and disengaged in a side-by-side orientation to each other to increase or decrease shelf width in a process substantially similar to that described and illustrated for adjacent floor members 12 because the floor extension members 18 include the same L-shaped hook 29 and gap 30 attachment means as the floor members 12.

Figure 4:
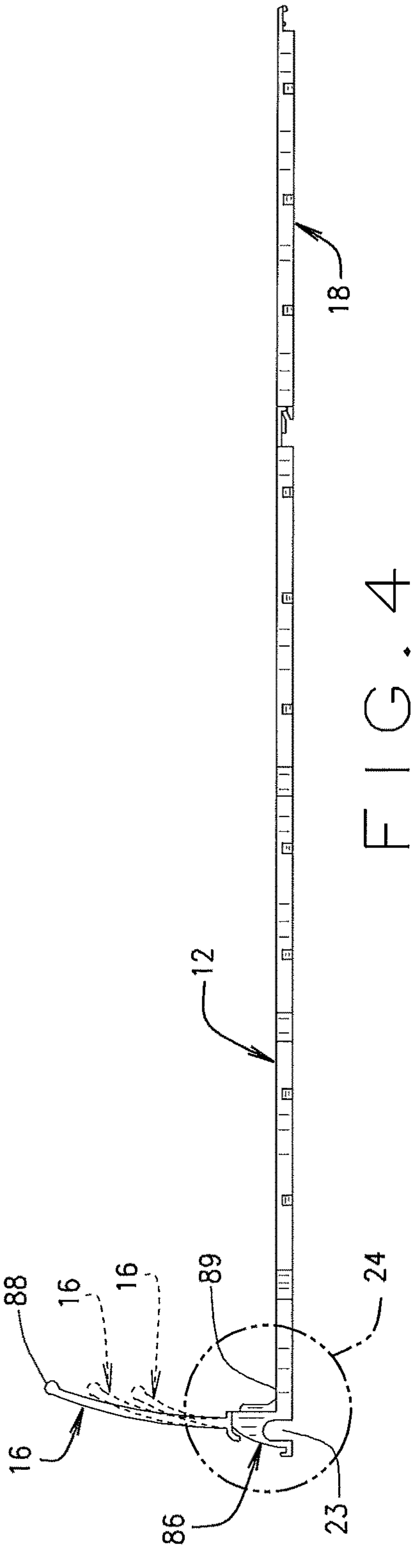
FIG. 4 illustrates a left side elevation view of the floor member engaged with a front wall member of FIG. 1.
Figure 5:
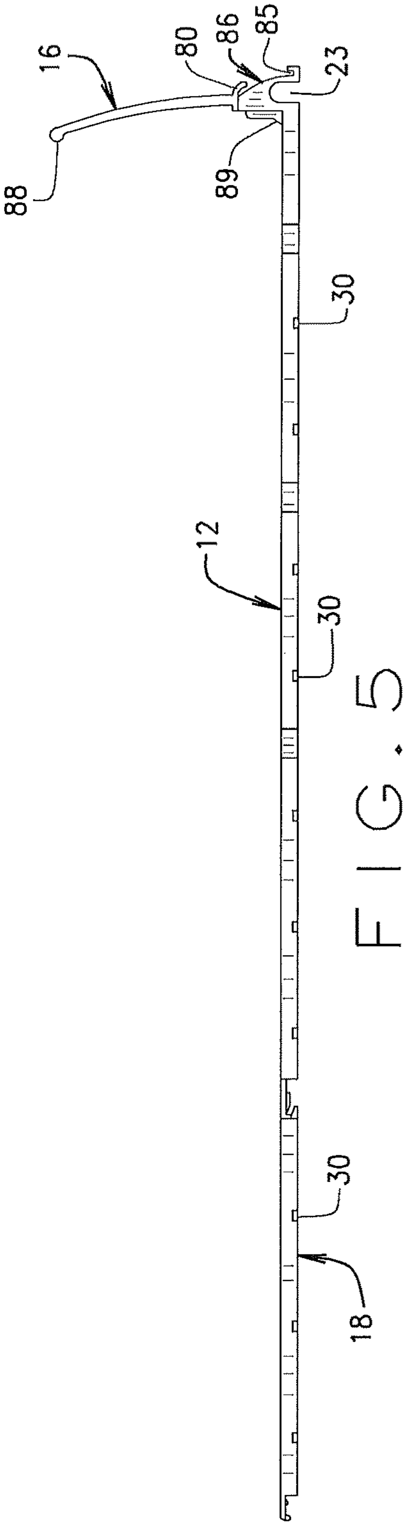
FIG. 5 illustrates a right side elevation view of the floor member and front wall member of FIG. 4.
Figure 6:
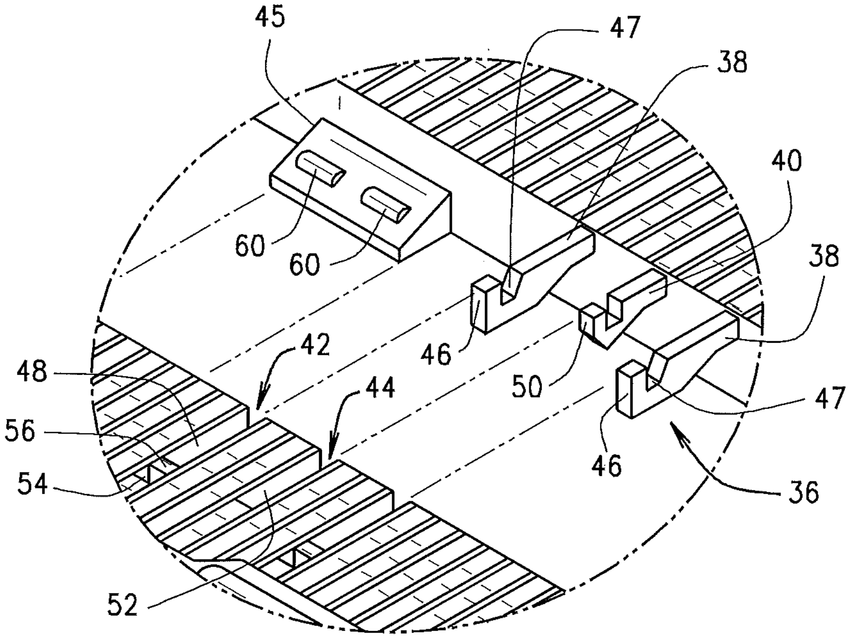
FIG. 6 illustrates an enlarged, exploded perspective view of the connection means associated with the floor member and floor extension member of FIG. 2.

It can be beneficial to make shelving units capable of being lengthened to accommodate additional product or uniquely sized and shaped product, or to accommodate longer shelf support structures. FIGS. 4 and 5 illustrate side elevation views of floor members 12 further attached to floor extension members 18 so as to lengthen the overall shelf. The connection means by which a floor member 12 and a floor extension member 18 are attached to each other is illustrated in FIGS. 6, 7, 7A and 7B. FIG. 6 is an enlarged view taken from FIG. 2 and illustrates a plurality of groups of finger members 36 extending from the front portion of the floor extension member 18 at spaced locations along its width. Each group of finger members 36 includes two outer fingers 38 and an inner finger 40. It is foreseeable that in other embodiments of the present invention, there may be more or fewer than three finger members associated with each group 36.

The outer fingers 38 are sized and positioned to selectively engage outer receivers 42 located on the rear portion of the floor members 12 and the inner finger 40 is sized and positioned to selectively engage inner receiver 44 located between the two outer receivers 42. In the embodiment illustrated in FIGS. 1 and 2, a floor member 12 includes four outer receivers 42 and two inner receivers 44, and floor extension member 18 includes four outer fingers 38 and two inner fingers 40. The floor extension member 18 further includes an angular wedge member 45 positioned between a respective pair of finger groups 36, the wedge member 45 supporting the engagement of a floor member 12 and extension member 18 in the arrangement described hereinbelow.

In operation, the finger members 38, 40 engage the receivers 42, 44 in the following manner. Lead portions 46 of outer fingers 38 are first inserted downwardly through rear apertures 48 of the outer receivers 42 such that the lead portions 46 of the outer finger members 38 project downwardly through the rear apertures 48. At the same time, the lead portion 50 of the inner finger 40 is inserted into an aperture 52 of inner receiver 44 such that lead portion 50 projects downwardly through the aperture 52. Next, the lead portions 46 should be inserted inwardly then upwardly into front apertures 54 of the outer receivers 42 such that the space 47 of outer fingers 38 mate with a rib or flange portion 56 that divides the rear aperture 48 from the front aperture 54.

Figure 7:
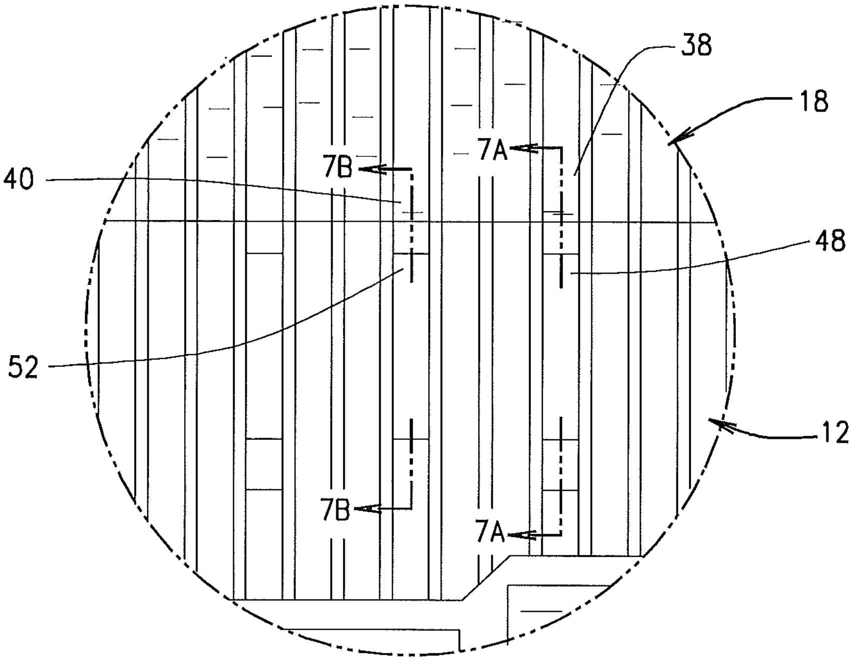
FIG. 7 illustrates an enlarged top plan view of a top portion of the floor member and floor extension member of FIG. 8 shown in their engaged position.
Figure 7A:
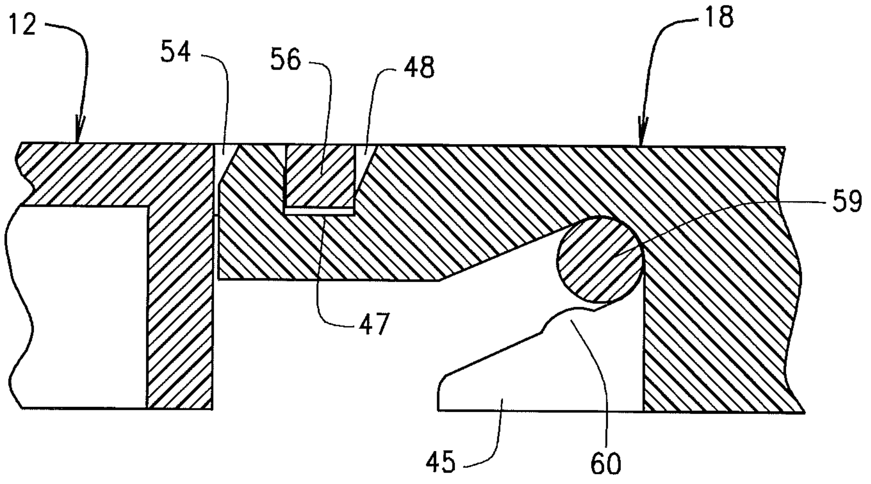
FIG. 7A illustrates a cross-section view of the engagement of an outer finger member and an outer receiver of a floor extension member and floor member respectively, taken along line 7A-7A of FIG. 7.
Figure 7B:
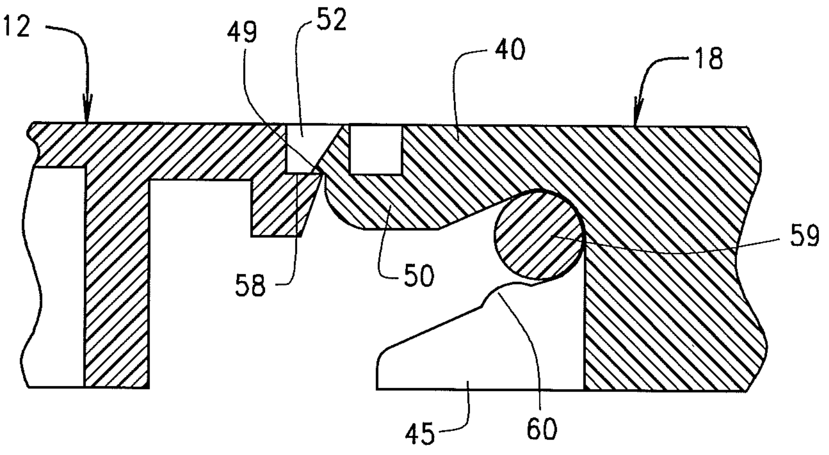
FIG. 7B illustrates a cross-section view of the engagement of an inner finger member and an inner receiver of a floor extension member and floor member respectively, taken along line 7B-7B of FIG. 7.

FIG. 7 illustrates an enlarged view of the connection between a floor member 12 and a floor extension member 18. FIG. 7A is a cross-sectional view taken along the longitudinal portion of a connection between an outer finger 38 and outer receiver 42 along line 7A-7A of FIG. 7, and FIG. 7B is a cross-sectional view taken along the longitudinal portion of a connection between an inner finger 40 and an inner receiver 44 along line 7B-7B of FIG. 7. In FIG. 7A, the lead portion 46 has already entered the rear aperture 48 and is releasably secured in the front aperture 54. The outer finger 38 is mated with rib portion 56. In FIG. 7B, after the lead portion 50 of the inner finger 40 has been pulled upwards into the aperture 52, a barb 49 of the lead portion 50 engages ledge 58 of the inner receiver 44.

When the floor member 12 and extension member 18 are engaged with one another, a rounded lip 59 extending downward from the rear terminal end portion of floor member 12 illustrated in FIG. 2 is associated with and abutted by projection members 60 positioned on and extending upwardly from the angular wedge member 45. This engagement is further supported by the angular wedge member 45. When the floor member 12 and extension member 18 are engaged in the above configuration, the angular wedge member 45 and its associated projection members 60 act as a stabilizing mechanism. When a downward or upward force is applied to either the floor member 12 or extension member 18, the wedge member 45 and projection portions 60 provide an additional support structure to prevent excess empty space between the members 12 and 18, and thus prevent one member from applying a high leverage force on the other member, which could cause the members 12 and 18 to disengage, or cause a finger member 38 and/or 40 to break.

To disengage the extension member 18 from the floor member 12, the floor member 12 should be pulled down and away from the floor extension member 18 in order to disengage the barb 49 from the ledge 58 of the inner receiver 44. Next, the floor member 12 should be pushed upward so as to disengage the outer fingers 38 from the front apertures 54. Finally, the outer fingers 38 should be pulled upwardly through and out from the rear apertures 48, while the inner finger 40 is pulled upwardly through and out from the aperture 52.

It is also recognized that the rear terminal end portion of each floor extension member 18 may also include the same configuration of slots or receivers 42 and 44 associated with the terminal end portion of each floor member 12 for engaging the plurality of finger members 38 and 40 associated with the front portion of each respective floor extension member 18. Each group of finger members 36 which includes two outer fingers 38 and an inner finger 40 (FIG. 6) may be positioned and located along the rear end portion of each respective floor extension member 18 as explained above with respect to floor member 12 for engaging another similarly constructed floor extension member 18. In this regard, any number of floor extension members 18 can be coupled together to extend the overall length of the floor member 12 to accommodate a particular or desired shelf length. Each floor extension member 18 will include at least one row of transverse slots 27B as will be hereinafter further explained.

Figure 8:
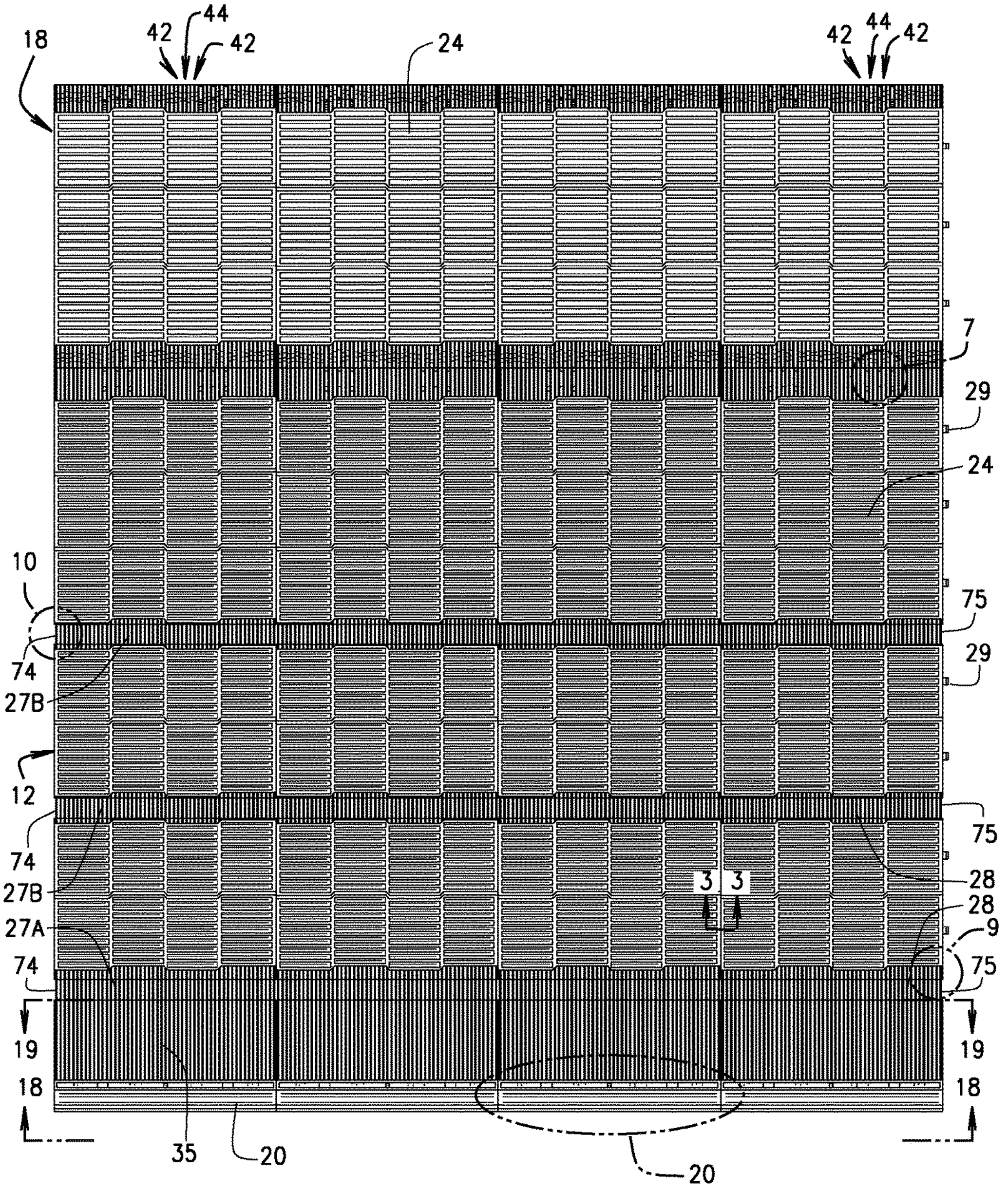
FIG. 8 illustrates a top plan view of a plurality of floor members engaged with a plurality of floor extension members.

FIG. 8 illustrates in greater detail a plurality of floor members 12 connected with one another and further connected with floor extension members 18, wherein the floor extension members 18 are further connected to one another. In FIG. 8, the aforementioned roller sections 24 and rollers are more clearly illustrated. Moreover, the plurality of rows of transverse slots 27 formed by rib members 28 of the floor members 12 are more clearly illustrated. The slots 27, which are for associating the floor member 12 with divider members 13 and/or 14, extend transversely across each floor member 12. The embodiment illustrated in FIG. 8 of the floor member 12 includes three rows of slots 27, wherein a front row of transverse slots 27A differs in structure from the remaining two rear rows of transverse slots 27B, and wherein it is recognized and anticipated that an embodiment with more or fewer rows of transverse slots 27 is also envisioned. As best illustrated in FIGS. 2 and 8, the front row of transverse slots 27A are positioned and located between the front product bumper 20 and the front group of roller sections 24, and the plurality of rear rows of transverse slots 27B are positioned and located between and separating adjacent roller sections 24.

FIG. 9 is an enlarged partial top plan view of the front row of transverse slots 27A associated with floor member 12. In the front row of slots 27A, each slot 27A includes a ridge 62 that extends transversely across a back portion of each respective slots 27A. The ridge 62 is for selective engagement with a divider member 13 and/or 14 as will be hereinafter explained.

FIG. 10 is an enlarged partial top plan view of a remaining rear row of transverse slots 27B. The rib members 28 forming the rear rows of transverse slots 27B each include at least one projection 63, as illustrated.

The transverse slots 27A and 27B aid in engaging and releasably securing any plurality of divider members 13 and/or 14 to the floor member 12 for forming any plurality of product channels 22 as will be hereinafter explained.

FIG. 11 illustrates a perspective view of a right-facing divider member 13 and FIG. 12 illustrates a perspective view of a left-facing divider member 14 constructed according to the teachings of present invention. The right facing divider member 13 should be attached to a floor member 12 at the left side end portion of a roller glide system 10 to form the side portion of a left-most product channel 22, and the left-facing divider member 14 should be attached to a floor member 12 at the right side end portion of a roller glide system to form the side portion of a right-most product channel 22. FIGS. 1 and 2 illustrate the respective positioning of the divider members 13 and 14 at the left and right side end portions of the floor member 12. The divider members 13 or 14 that are attached between the respective side end portions of a particular floor member 12 as will be hereinafter explained may interchangeably be either right-facing divider members 13, left-facing divider members 14, or any combination thereof. Both divider members 13 and 14 are capable of containing product and preventing product from sliding off of the rear end portion of the roller glide system 10 because they both include a rear product stop bumper 64 that is associated with the rear terminal end portion of each respective divider members 13 and 14, which bumpers 64 are each engageable with the rear end portion of floor member 12 or the rear end portion of floor extension member 18. Other than the respective opposite side end portions of a particular floor member 12, any divider member 13 or 14 can be used therebetween to form a particular product channel 22.

FIG. 13 illustrates a right side elevation view of the left-facing divider member 14 of FIG. 12 and FIG. 14 illustrates a left side elevation view of the left-facing divider member 14 of FIG. 12. The divider members 13 and 14 each further include a plurality of tabs 65 including front tab 65A and two remaining rear tabs 65B. The tabs 65 of the divider members 13 and 14 are received within the slots 27 and releasably secured to a corresponding rib member as will be hereinafter explained. Slits or openings 69 associated with each divider member 13 and 14 allow the divider members 13 and 14 to be flexible along their longitudinal axis to allow a user to more easily secure and detach the tabs 65 to and from the slots 27. Each slit or opening 69 extends in a vertical direction at least partway along the full height of each divider member 13 and 14 essentially segregating each divider member into a plurality of segmented portions. Each segmented portion is therefore capable of flexing and/or bending due to the resiliency of each of the divider members 13 and 14 and due to the spaced positioning of the slits or openings 69. This means that even if the present floor member 12 is allowed to sag or bow towards its center for whatever reason, the segmented portions of the divider members 13 and 14 will not prohibit or restrict the movement of product positioned therebetween even if such divider members extend into the respective product channels. This is true because the present slit or opening arrangement allows each segmented portion to flex and bend sidewardly away from the product containers as such product containers move therebetween from the rear of the floor member towards the front thereof. This provides sufficient flexibility to each respective divider member so as to allow each of the segmented portions associated therewith to closely follow and flex with the shape of the product containers as they move therebetween if the divider members do in fact come into contact with the product containers for whatever reason. This mechanism provides a mechanism for substantially eliminating any binding or squeezing of the product containers by the divider members as such product containers move therebetween and such construction ensures free movement of the products within each product channel in a gravity feed situation.

It is also noted that the divider members 13 and 14 may be fabricated in a corrugated wall pattern as illustrated in FIGS. 11-14. This corrugated pattern adds to the flexibility of the overall divider members 13 and 14 and it likewise provides additional strength to each divider member particularly when flexing.

Figure 15:
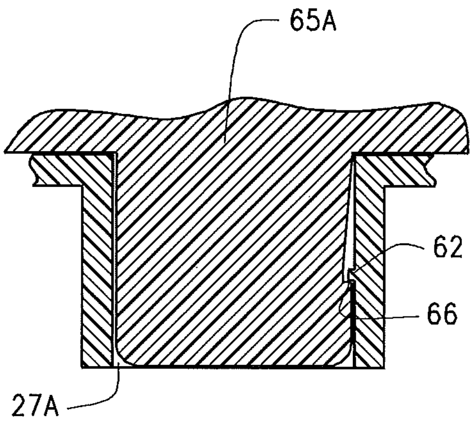
FIG. 15 illustrates a cross-section view of the engagement of the front tab member associated with a divider member and a front transverse slot of the floor member taken along line 15-15 of FIGS. 1 and 9.
Figure 16:
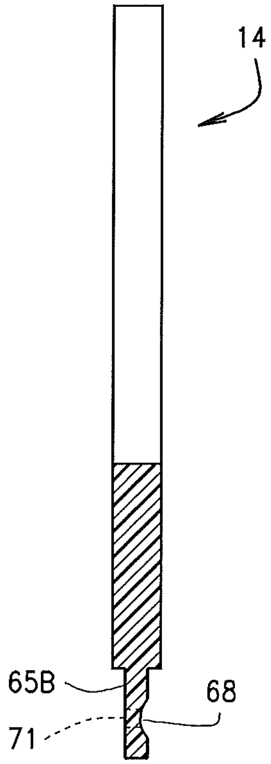
FIG. 16 illustrates a cross-section view of the left-facing divider member taken along line 16-16 of FIG. 14.
Figure 17:
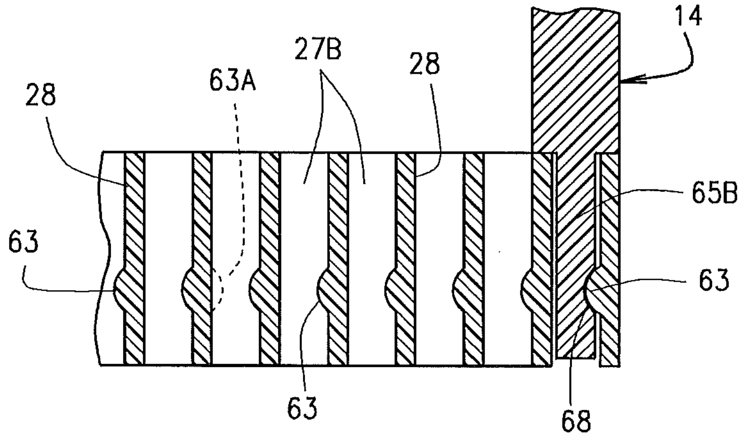
FIG. 17 illustrates a cross-section view of the engagement of a rear tab member associated with a left-facing dividing member and a rear transverse slot of the floor member taken along line 17-17 of FIG. 1.

The front tab 65A includes a node 66 as best illustrated in FIG. 15, the node being sized and positioned to selectively mate with the ridge 62 (FIG. 9) associated with the front row of transverse slots 27A. When a divider member 13 or 14 is selectively engaged with a floor member 12, the node 66 is pushed past and secured by the ridge 62 such that the divider member 13 or 14 forms a first attachment means with the floor member 12. FIG. 15 illustrates a cross-section view of the ridge 62 of a front row slot 27A abutted with and engaging the node 66 of a front tab 65A. Note that the rear tabs 65B of the divider members 13 or 14 must also be attached to the floor member 12 to completely and releasably secure the divider member 13 or 14 to the floor member 12. To facilitate the engagement of the remaining rear tabs 65B to remaining rear rows of transverse slots 27B, the rear tabs 65B include at least one recess 68 as best shown in FIG. 16. The recess 68 of each rear tab 65B is sized and positioned to selectively mate with the at least one projection 63 of a rib member 28 located in each of the rear rows of transverse slots 27B associated with both the floor member 12 and the floor extension member 18. FIG. 16 illustrates a cross-section view of a divider member 14 and its associated rear tab 65B and recess 68. When the recess 68 and the projection 63 mate in the rear rows of slots 27B, divider member 13 or 14 attaches to the floor member 12 or to floor extension member 18 in a substantially vertical orientation as illustrated in the cross-section view of FIG. 17.

In some applications, depending upon the type of material used for the floor member 12 and divider members 13 and 14, and depending upon the type of products to be dispensed from the present system, the recess 68 associated with each rear tab 65B may instead be replaced with a hole 71 as illustrated in dotted outline form in FIG. 16. In certain situations, the recess 68 may not provide sufficient engagement to hold the respective divider member in a proper stable position. In this situation, a through hole 71 will engage the projection 63 associated with a particular rib member 28 located in each of the rear rows of transverse slots 27B. The hole 71 provides a hard edge around its periphery which provides for better gripping action with respect to receiving and engaging the projection 63. If a softer material is used with respect to the divider member 13 or 14 and/or its respective rear tabs 65B, it is also recognized and anticipated that another projection 63A may be associated with the opposite rib member 28 forming a particular slot 27B as illustrated in dotted outline form in FIG. 17. In this particular embodiment, both projections associated with a particular slot 27B would engage the hole 71 from opposite sides.

The divider members 13 and 14 also include rear product stop bumper 64 as best illustrated in FIGS. 11-14. The rear product stop bumper 64 defines the rear terminal end boundary of the divider members 13 and 14, and its orientation dictates whether the divider member is a right-facing divider member 13 or a left-facing divider member 14. When the rear product stop bumper 64 extends perpendicularly from the right, rear portion of the divider member, the divider member is a right-facing divider member 13 and when the rear product stop bumper 64 extends perpendicularly from the left, rear portion of the divider member, the divider member is a left-facing divider member 14. The rear product stop bumper 64 forms the terminal end portion of a product channel 22 when a divider member 13 or 14 is engaged with a floor member 12, or with a floor extension member 18, and prevents product from exiting a product channel 22 from the rear. The rear product stop bumper 64 further includes a C-shaped channel portion 70 as best illustrated in FIG. 14 for engaging the divider member 13 or 14 to the rear terminal end portion of each floor member 12, or floor extension member 18. It is recognized that, in the alternative embodiment wherein a floor member 12 is connected to one or more floor extension members 18 to extend shelf length as previously explained, the divider member would be longer, and its C-shaped channel portion 70 would engage the rear terminal end portion of the last floor extension member 18 connected to the floor member 12 as previously explained with respect to floor member 12.

Figure 18:
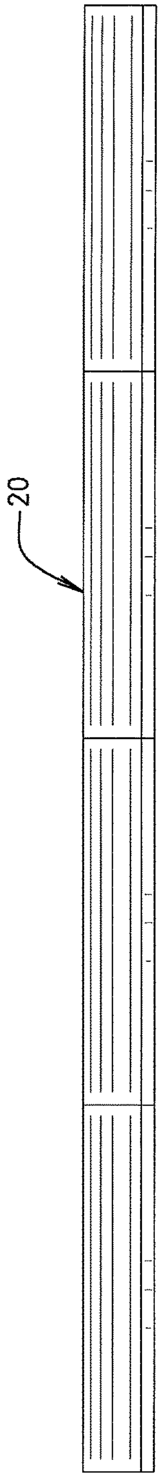
FIG. 18 illustrates a front elevation view of the front product bumper taken along line 18-18 of FIG. 8.
Figure 20:
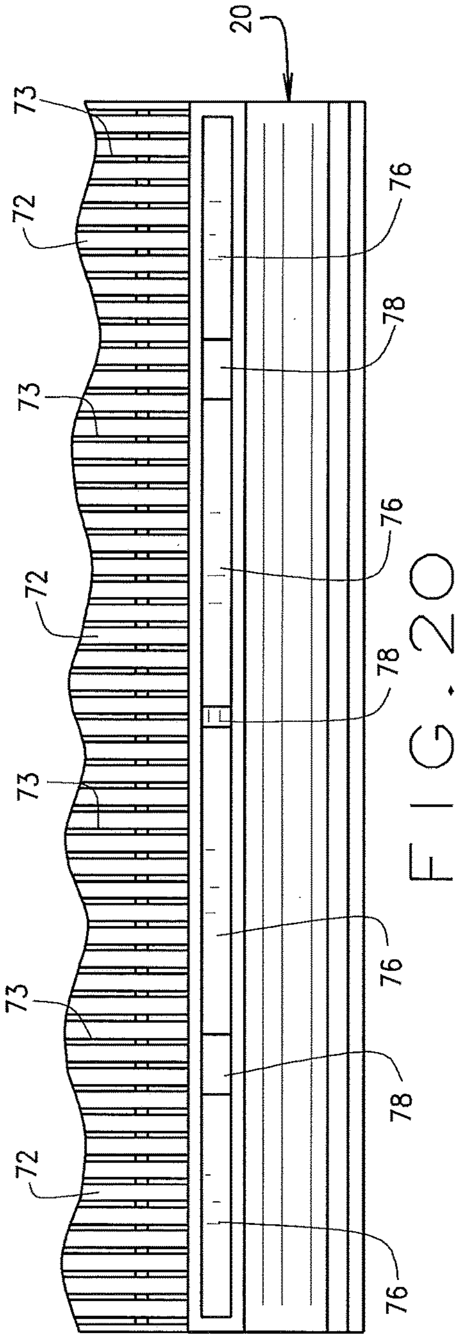
FIG. 20 illustrates an enlarged top plan view of the front product bumper of FIG. 8.

FIG. 18 illustrates a front elevation view of the front product bumper 20 associated with floor member 12 taken along line 18-18 of FIG. 8 while FIG. 19 illustrates a rear elevation view of the same front product bumper 20 taken along line 19-19 of FIG. 8. The front product bumper 20 includes front and rear portions as well as a plurality of upward extending rib members 73 positioned and located along its rear portion, the rib members 73 forming upward extending slots 72 therebetween as best illustrated in FIGS. 19 and 20. FIG. 20 is an enlarged partial top plan view of the front product bumper 20 illustrating the upward extending slots 72 formed by the plurality of rib members 73, of the same width, and which extend along the same longitudinal axis as the transverse slots 27 of the floor member 12.

In order to engage a divider member 13 or 14 with a floor member 12 to define a product channel 22, a user would first engage the C-shaped channel portion 70 to the rear terminal end portion of the floor member 12 in a location where a user wishes to define one side of a product channel 22. Next the user would insert the rear tabs 65B into each of the two corresponding slots 27 of the remaining rear rows of transverse slots 27B along the longitudinal axis desired for the divider member 13 or 14. Doing so allows the recess 68 or hole 71 of each rear tab 65B to engage the projection 63 associated with a rib member 28 forming each slot 27B and thus further secures the divider member 13 or 14 to the floor member 12. Next, the front tab 65A of the divider member 13 or 14 is inserted into a slot 27 of the front row of transverse slots 27A that lies along the same longitudinal axis as the slots 27B with which the divider member 13 or 14 was previously engaged. When a downward force is applied to the front tab 65A, the node 66 will be pushed pass the ridge 62 and will engage the bottom side of ridge 62 associated with a rib member 28 forming a slot 27A. Finally, the front portion 67 of the divider member 13 or 14 should be inserted into a slot 72 of the front product bumper 20 that lies along the same longitudinal axis as the divider member 13 or 14 and the slots 27 in which the tabs 65 are engaged.

When the aforementioned attachments have been made, one side portion of a product channel 22 is formed by the divider member 13 or 14 which has been releasably secured to a floor member 12. The same procedure is followed in order to attach another divider member 13 or 14 to form another side of a product channel 22. This process is repeated to generate additional product channels 22. Depending on the transverse location where the divider members 13 or 14 are engaged to a particular floor member 12, or to floor extension members 18 connected thereto, product channels 22 of varying widths may be formed.

It should further be noted that each floor member 12 may be of a different width and each includes a first exposed side portion 74 (FIG. 8) when it is not engaged with another floor member 12, the side portion 74 being located on the same side of the floor member 12 as the gaps 30, with a second side portion 75 (FIG. 8) being located on the same side of the floor member 12 as the L-shaped hooks 29. The side portions 74 and 75 are indented spaces formed at the respective opposite end portions of a transverse row of slots 27 adjacent the outmost rib members 28 as best shown in FIGS. 8-10. When two adjacent floor members 12 are releasably attached to one another, the side portions 74 and 75 align with one another and form additional slots substantially similar to those in the front row of slots 27A and the rear row of slots 27B, thus providing an additional plurality of slots where a divider member 13 or 14 may be releasably secured to form a side portion of a product channel 22. The specific means by which the additional slots are generated is described below.

FIG. 9 illustrates a side portion 75 associated with a front row of transverse slots 27A. The outermost rib members 28 of side portions 74 and 75 associated with a front row of slots 27A each include a portion of the ridge 62A, the ridge 62A being substantially similarly shaped to the ridges 62 found within slots 27 of the front row of slots 27A. Thus when a portion of the ridge 62A of side portion 74 mates with and abuts a portion of the ridge 62A associated with the opposite side portion 75 of an adjacent floor member 12, an entire ridge 62 is formed therebetween for engaging the node 66 of front tab 65A. Also, the outermost rib member 28 of side portions 75 that are associated with and lie within the same transverse axis as the rear rows of slots 27B each further include a projection 63 that extends from the last outermost rib member 28 associated with the side portions 75 as illustrated in FIG. 10 such that the additional slots formed by side portions 74 and 75 associated with the remaining rear rows of transverse slots 27B each include a projection 63. Therefore, when adjacent floor members 12 are releasably secured to one another in a side-by-side arrangement, the side portions 74 and 75 of the respective floor members 12 form slots that are substantially similar to the front and rear rows of slots 27A and 27B such that a divider member 13 or 14 may be releasably secured within the slots formed between the two adjacent floor members 12.

To disengage a divider member 13 or 14 from a floor member 12, the reverse steps should be taken as those to engage the divider members 13 and 14 as explained above. The front portion of the divider member 13 or 14 should be pulled upwardly and out from the slots 72 of the front product bumper 20, and at the same time, the front tab 65A should be pulled upwardly to disengage the node 66 associated with the front tab 65A from the ridge 62 associated with the front row of slots 27A. Next the divider member 13 or 14 should be pulled slightly laterally so as to disengage the recesses 68 or holes 71 of the rear tabs 65B from the projections 63 associated with the rib members 28 in the rear rows of slots 27B. The divider member 13 or 14 should then be pulled upward and away from the floor member 12 such that the rear tabs 65B disengage from the rear rows of slots 27B. Finally, the C-shaped channel portion 70 of the divider member 13 or 14 should be pulled away from the rear terminal end portion of the floor member 12, or the floor extension member 18.

It should be noted that while a longer divider member would be needed to engage a floor member 12 further connected to one or more floor extension members 18, a similar process would be used to both engage and disengage a longer divider member 13 or 14 associated with an engaged floor member 12 and floor extension member 18. The longer divider members include at least one additional tab 65 substantially similar to the rear tabs 65B of the divider members 13 or 14, and each floor extension member 18 includes at least one additional row of transverse slots 27 substantially similar to the rear rows of slots 27B of the floor member 12. The longer divider member would also include a rear product stop bumper substantially similar to rear product top bumper 64. In alternative embodiments, the longer divider member may include more tabs than the one additional tab 65, and the floor extension members 18 may include additional rows of transverse slots 27B.

The front product bumper 20 helps to prevent product from toppling over the roller glide system 10 as product travels in the gravity feed orientation on the floor members 12. There are times that product such as bottles, cans, or packages gain a significant amount of momentum as they travel down the floor member 12 to be dispensed. The front product bumper 20 helps to prevent such toppling over the front portion of the floor member 12 by making first contact with the product as it slides down the floor member 12, and halts the product momentum.

Depending upon the size and shape of the product to be dispensed, the front product bumper 20 may not be tall enough to adequately stop and prevent the front product from toppling over the bumper 20. In this case, the front product bumper 20 includes a plurality of slots or cavities 76 located within the bumper 20 as best illustrated in FIG. 20. The cavities 76 extend downwardly within the front product bumper 20 and are separated from other cavities 76 by a plurality of divider means 78, and the end walls of the front product bumper 20. The cavities 76, divider means 78 and end walls provide a means by which the product bumper 20 may be engaged with a taller front wall member 16 such that the halting momentum arrestor means (the front product bumper 20 engaged with the front wall member 16) may be taller and thus more effective in preventing taller products from toppling over the front portion of the roller glide system 10.

Figures 21, 22, 23, 24:
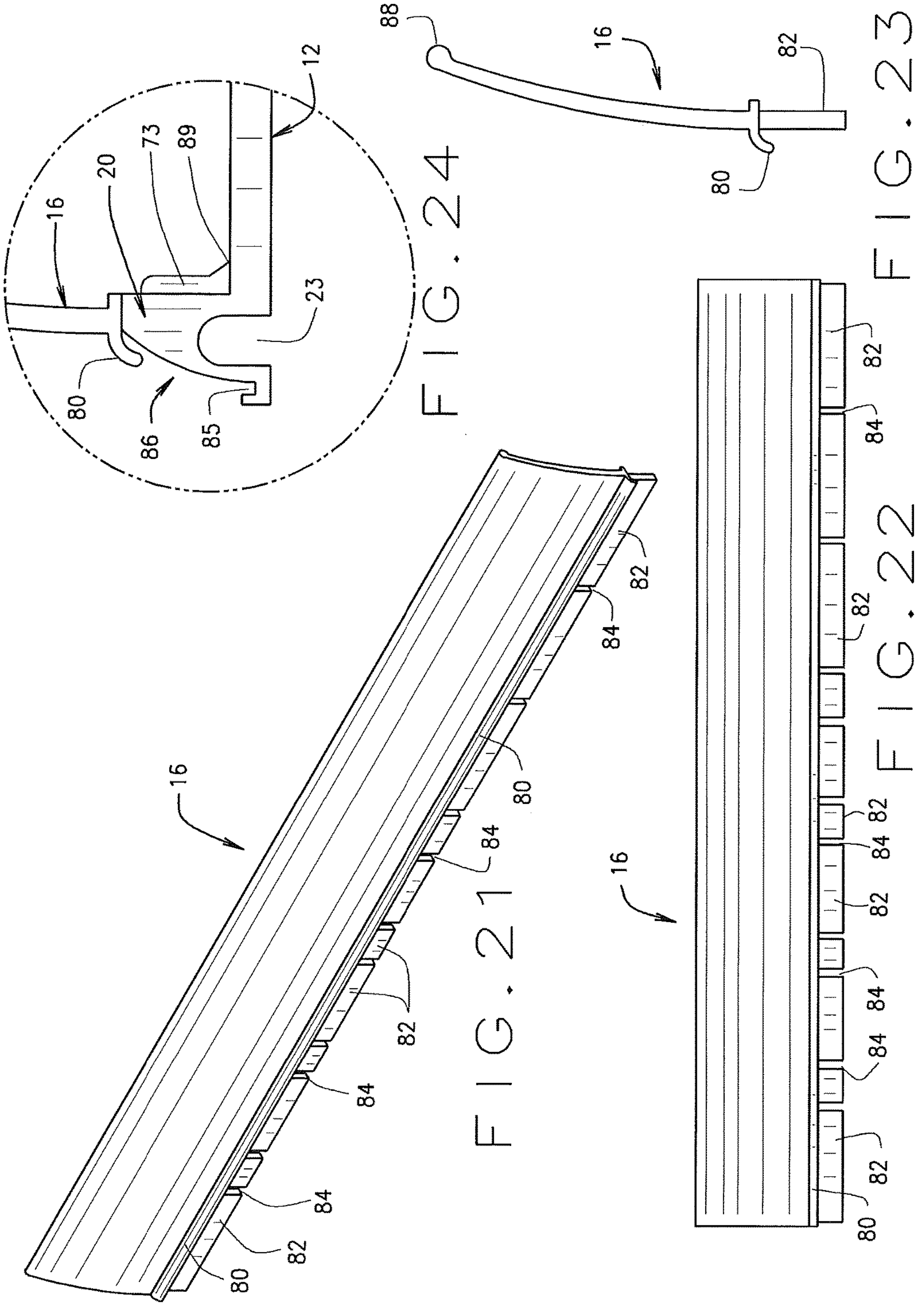
FIG. 21 illustrates a perspective view of a front wall member of the shelf roller glide system of FIGS. 1 and 2 constructed according to the teachings of the present invention.
FIG. 22 illustrates a front elevation view of the front wall member of FIG. 21.
FIG. 23 illustrates a side elevation view of the front wall member of FIG. 21.
FIG. 24 illustrates an enlarged view of a price channel formed by the engagement of the front wall member of FIGS. 21-23 with a front product bumper of FIGS. 2 and 8.

FIGS. 21. 22 and 23 illustrate the front wall member 16. The wall member 16 includes an overhanging lip portion 80 and a plurality of downward extending flanges 82 for association with the cavities 76 of the front product bumper 20. The flange portions 82 are of varying widths such that the wall member 16 may be utilized not only in the present embodiment, but in the second floor embodiment 110 described in detail hereinbelow. The flanges 82 are separated by slits 84 that extend upwardly towards the overhanging lip portion 80 of the front wall member 16. The slits 84 are positioned and located to engage at least some of the divider means 78 and, if necessary, some of the end walls associated with front product bumper 20.

A front wall member 16 is selectively engaged with the front product bumper 20 by aligning a given flange 82 with a given cavity 76, and inserting the flange 82 into the cavity 76 such that the slits 84 engage the corresponding divider means 78 and, if necessary, at least one end wall of the front product bumper 20. When this association is made, the overhanging lip portion 80 of the front wall member 16 abuts the top portion of the front product bumper 20 and prevents it from being further inserted into the front product bumper 20 as best illustrated in FIG. 24. The overhanging lip portion 80 and a U-shaped channel 85 located at the base of the front product bumper 20 form a graphic/price channel 86. The graphic/price channel 86 may serve as a means for inserting graphic panels containing information relating to the products being displayed in the respective product channels 22 such as price, brand name or quantity for consumers to consider when making purchases. The channel 86 is constructed such that the graphic panels slidably insertable therein may be easily removable and replaceable so as to reflect the most up-to-date product information.

The front wall member 16 is also constructed with a generally curved profile as illustrated in FIG. 23 such that product traveling down the roller glide floor member 12 makes first contact with a beaded portion or projection 88 located at the top portion of the front wall member 16. The beaded top portion 88 acts as a shock absorbing means to decrease the likelihood of a product toppling over the wall member 16. The beaded portion or projection 88 is also located in front of the intersection 89 of the front product bumper 20 and the floor member 12 such that the beaded portion 88 makes first contact with the upper portion of the front product before its lower portion makes contact with the front product bumper 20. This ensures that the front product does not make first contact with intersection 89 thus further decreasing the likelihood that the front product would topple over the wall member 16. Also, importantly, the curved profile of the wall member 16 further prevents the front product from making direct contact with the remaining portion of the front wall member 16 thereby minimizing scratching of the clear or transparent wall surface so that product can always be clearly seen through the front wall member 16. In this regard, the front wall member 16 may also be angled or otherwise angularly shaped instead of curved so as to minimize scratching of the front wall member surface.

It is noted that in alternative embodiments of the present invention, the front wall member 16 may be constructed in a plurality of different heights to arrest the momentum of product having various heights. For example, a wall member 16 to halt the momentum of a standard twenty ounce bottle would be taller than a wall member 16 to halt the momentum of a standard twelve ounce can. In the various embodiments of the front wall member 16 with varying heights, the wall member still includes the overhanging lip portion 80 and flanges 82 that aid in selectively securing the wall member to the front product bumper 20. FIG. 4 illustrates a plurality of front wall members 16 in dotted outline form having varying heights for association with the front product bumper 20.

Figure 25:
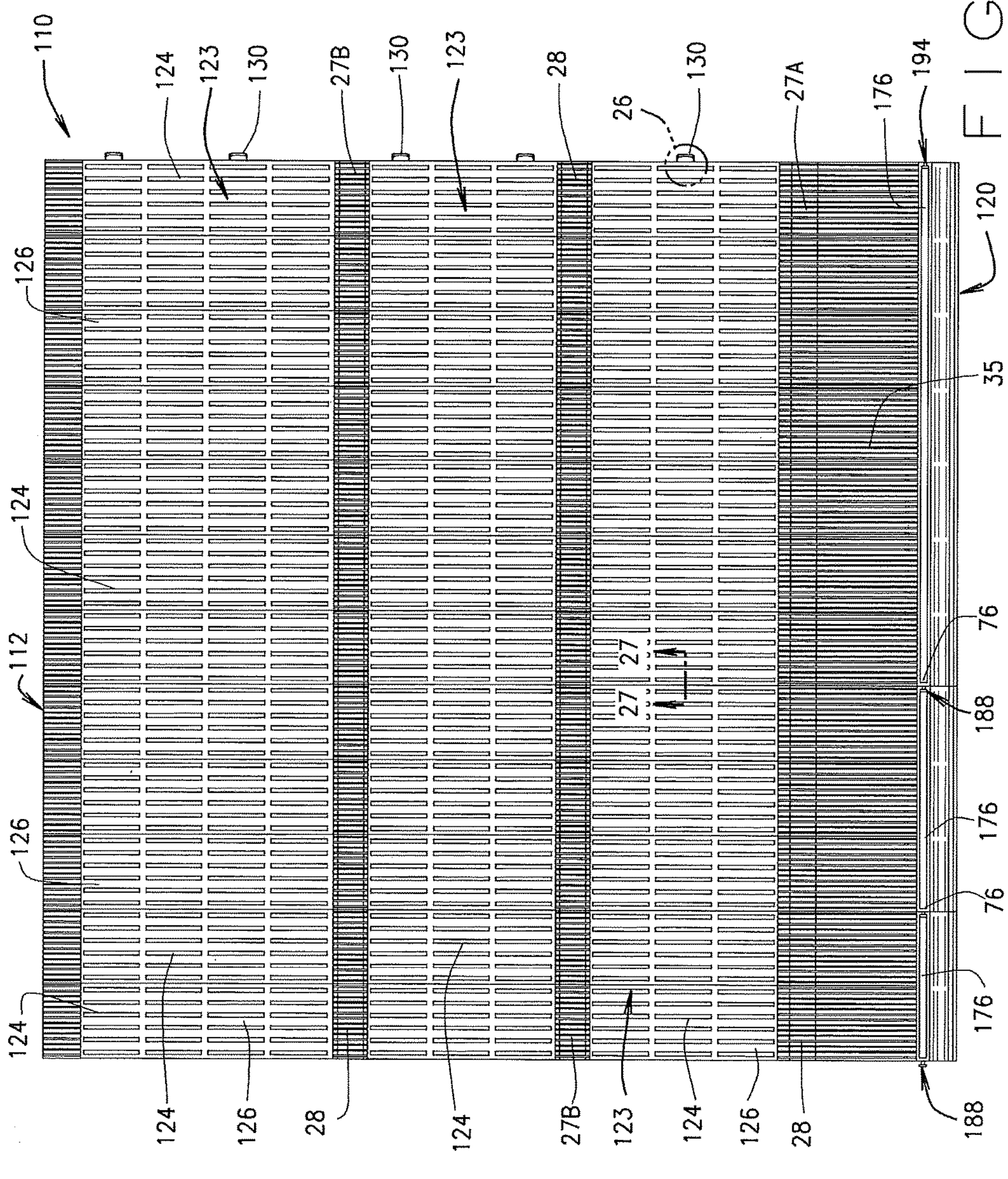
FIG. 25 illustrates a top plan view of another embodiment of a floor member constructed according to the teachings of the present invention showing a plurality of attached floor members of a standard glide system.

The present invention further includes a second embodiment, the standard shelf glide system 110, using another embodiment of a floor member 112 as illustrated in FIG. 25. Like the roller glide system 10, the standard shelf glide system 110 acts as a gravity feed shelf for stocking, dispensing, and re-stocking merchandising product such as individual bottles or cans, as well as packaged bottles and cans as needed, and uses the same divider members 13 and 14 and the same front wall member 16. In the two system embodiments 10 and 110, there is no difference between the divider members 13 and 14, and the front wall member 16, the members 13, 14 and 16 being used interchangeably in the roller glide system 10 and in the standard glide system 110.

Unlike the floor member 12 associated with the roller glide system 10, floor member 112 does not include roller sections 24 or any type of rollers, nor does the standard glide system 110 include an embodiment wherein shelf length is increased by the engagement of a floor extension member similar to floor extension member 18. In this regard, the floor member 112 can be made in a plurality of different lengths to accommodate a plurality of different shelf lengths and the member 112 can be custom made to a desired length to accommodate a particular application. The floor member 112 (FIG. 25) includes a plurality of track sections 123, each track section being formed by a plurality of spaced apart track members 124 which are shaped and configured to reduce the surface area of each floor member 112, thereby reducing friction and improving the efficiency of movement of products thereon. The plurality of slots or openings 126 formed between the track member 124 allow cool air to freely circulate therethrough and around the products positioned on the floor member 112. Like floor member 12, the floor member 112 also includes a plurality of transverse rows of slots 27 formed by a plurality of rib members 28 previously described with respect to the floor member 12. Like floor member 12, in the embodiment illustrated in FIG. 25, floor member 112 includes three transverse rows of slots 27, including a front row of transverse slots 27A and two rear rows of transverse slots 27B, the slots 27 being substantially similar to those of the floor member 12 described above in detail. Here again, the front row of transverse slots 27A are positioned and located between the front product bumper 120 and the front track sections 123, the landing zone 35 extending therebetween. The plurality of rear rows of transverse slots 27B are positioned and located between and separating adjacent track sections 123 similar to floor member 12. Embodiments of the standard glide system 110 including more or fewer rows of slots 27 are further envisioned. It is also recognized and anticipated that a floor extension member similar to extension member 18, except using track members 124 instead of rollers, could likewise be used with floor member 112 in which case the terminal end portion of floor member 112 would include the receivers 42 and 44 as previously explained. The means by which divider members 13 and 14 engage and disengage floor member 112 is substantially similar to the means previously described herein for floor member 12 including projections 63, recesses 68 or holes 71.

Figure 26:
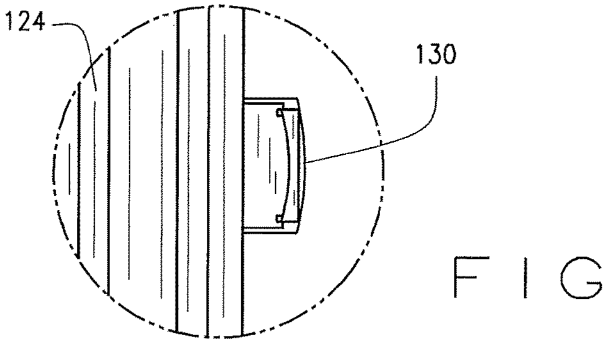
FIG. 26 illustrates an enlarged top plan view of an L-shaped projection associated with the standard glide floor member of FIG. 25.
Figure 27:
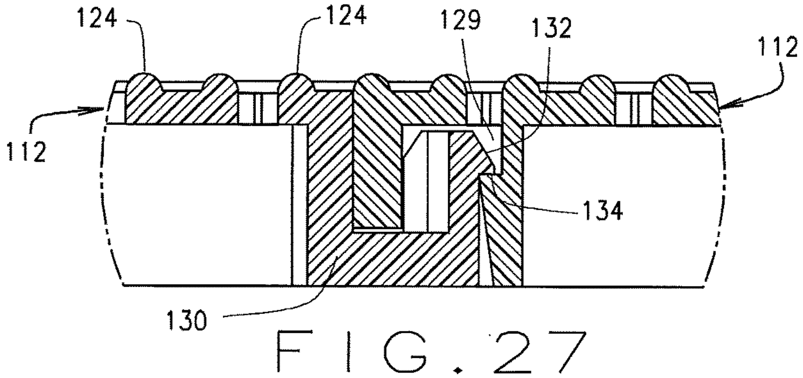
FIG. 27 illustrates a cross-section view of the engagement of an L-shaped projection and a cavity associated with the floor member of FIG. 25 taken along line 27-27 of FIG. 25.

In the present embodiment, the mechanism used to releasably secure adjacent floor members 112 to one another in a side-by-side arrangement is similar to the mechanism in the previously described floor member 12. Each floor member 112 includes a plurality of spaced apart cavities 129 as best illustrated in FIG. 27 located on the bottom side portion of the floor members 112 along one side thereof and a plurality of spaced apart L-shaped projections 130 located on the opposite side of the floor member 112 lying in the same transverse axis as the cavities 129. The cavities 129 and projections 130 are sized and positioned to selectively mate and engage one another to join adjacent floor members 112. An enlarged top plan view of the L-shaped projection 130 is illustrated in FIG. 26.

FIG. 27 illustrates a cross-section view of one L-shaped projection 130 engaged with a corresponding cavity 129 associated with adjacent floor members 112. When selectively engaged, the L-shaped projection 130 is inserted upward and into the cavity 129. A barb 132 on the L-shaped projection 130 slides pass and is secured by a ledge 134 associated with the cavity 129. To disengage adjacent floor members 112, the projection 130 is pulled away from the adjacent floor member 112 and pushed downwardly to both disengage the barb 132 from the ledge 134 and to disengage the projection 130 from the cavity 129.

Figure 28:
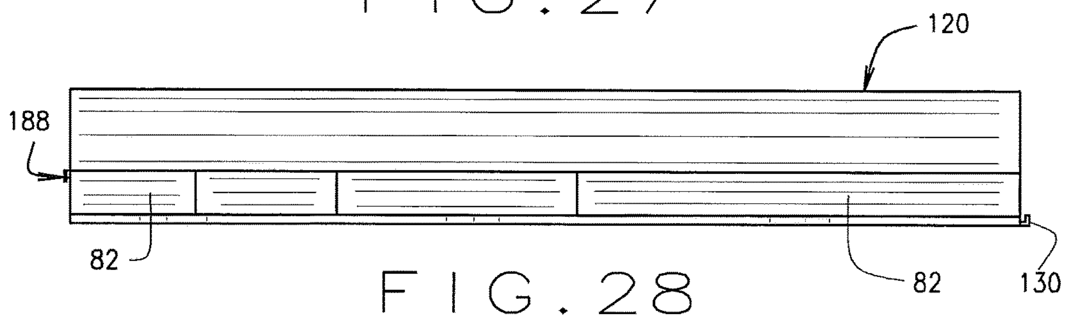
FIG. 28 illustrates a front elevation view of the front product bumper of the floor member of FIG. 25.
Figure 29:
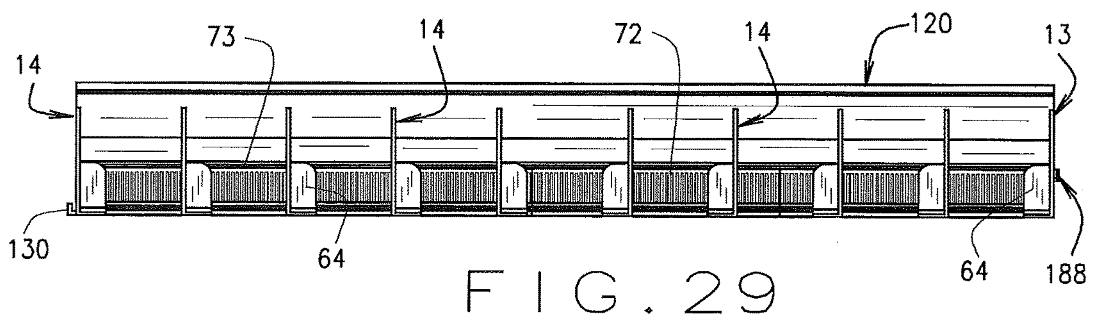
FIG. 29 illustrates a rear elevation view of the front product bumper of FIG. 28 engaged with a plurality of divider members of FIGS. 11 and 12.
Figure 30:
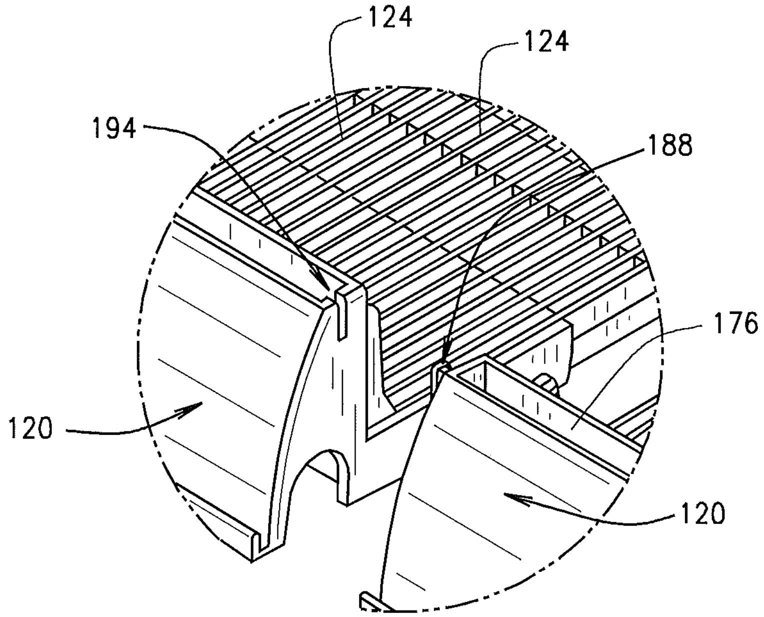
FIG. 30 illustrates an enlarged exploded perspective view of the engagement between adjacent front product bumpers of the floor member of FIGS. 25 and 28.
Figure 31:
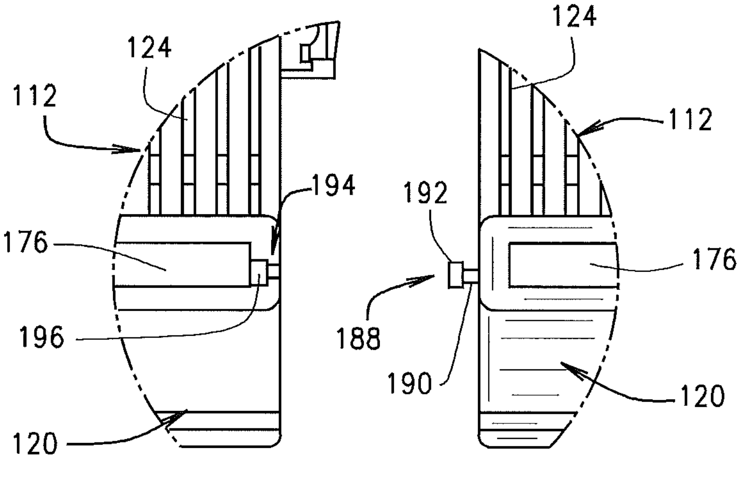
FIG. 31 illustrates an enlarged exploded top plan view of the engagement between adjacent front product bumpers of FIG. 30.

The means by which adjacent floor members 112 are engaged with one another further includes a means for engaging adjacent front product bumpers 120. As illustrated in FIGS. 28 and 29, the front product bumpers 120 of floor members 112 include a T-shaped boss 188 extending outwardly from an upper side portion of the front product bumper 120, the boss 188 including a stem portion 190 and a T-portion 192 as best illustrated in FIG. 31. The boss 188 may be positioned on the same side portion of the floor member 112 as the cavities 129. The front product bumper 120 further includes a T-shaped slot 194 positioned and located on the opposite side of the front product bumper 120 in substantial alignment with the boss 188, the boss 188 of one floor member 112 being receivable within a corresponding slot 194 associated with a corresponding adjacent floor member 112 as best illustrated in FIGS. 31 and 32. The boss 188 and slot 194 are sized and positioned to selectively engage one another and further engage adjacent front product bumpers 120 of adjacent floor members 112. When engaged, the T-portion 192 rests within a similarly shaped portion 196 of slot 194, the portion 192 preventing lateral movement of any one floor member 112 relative to another adjacent and engaged floor member 112. The boss 188 is disengaged from the slot 194 in a nearly simultaneous process as the L-shaped projections 130 are disengaged from the cavities 129 in order to disengage adjacent floor members 112. Specifically, when one floor member 112 is being disengaged from another floor member 112, the boss 188 is similarly disengaged from the slot 194. As a result, adjacent floor members 112 in the standard glide embodiment 110 are in communication with one another via two separate connection means. First, the members are selectively connected to one another via their plurality of L-shaped projection and cavity engagements 129 and 130, and secondly via the T-shape boss 188 and T-shaped slot 194 associated with the front product bumper 20.

In the standard shelf glide embodiment 110, the front wall member 16 is again selectively engaged with the front product bumper 120 as previously explained with respect to floor member 12 to further aid in halting the momentum of product as they move along the gravity feed tracks 124. Since the cavities 176 of the front product bumper 120 are of a different width than the cavities 76 of the front product bumper 20, the varying widths of the flanges 82 serve to satisfy the widths of both cavities 76 and 176, such that the wall member 16 is compatible for association with the cavities 76 and 176 of both front product bumpers 20, 120. The slits 84 are positioned and located in spaced relationship to each other such that some of the slits 84 will always be in alignment with the respective divider means 78 and, if necessary, one or both end walls of either front product bumper 20 or 120.

It is also anticipated that each respective floor member 12 and 112 can be fabricated with the front wall member 16 integrally formed with the front product bumper 20 or 120. In this particular embodiment, the front wall member would take on the shape and configuration of a single front wall member similar to that disclosed in FIGS. 4 and 5 wherein the front product bumper 20 and the front wall member 16 would be merged into a single curved or angled wall member, such structure retaining the upwardly extending slots 72 and the graphic/price channel 86. It is also recognized that the upwardly extending slots 72 and the graphic/price channel 86 could likewise be eliminated and the front wall member could merely consist of the curved or angled front wall member 16 with a bead or projection 88 associated with its top end portion. Other shapes and configurations associated with a combination of front product bumper 20 and 120 with front wall member 16 are likewise recognized and envisioned. Other variations and modifications to the various components comprising the present structures are also contemplated.

As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. A floor member for displaying products thereon comprising:

a front product bumper, a rear portion, opposed side portions, a landing zone, and a plurality of roller sections including a front roller section, each roller section including a plurality of rollers, said front product bumper having front and rear portions and including a plurality of upward extending rib members positioned and located on its rear portion, said plurality of upward extending rib members forming upward extending slots therebetween;

said landing zone being configured to absorb repeated impact applied to the landing zone from loading product onto a front portion of the floor member, said landing zone being positioned and located between said front product bumper and said front roller section and including a solid bottom portion;

a plurality of spaced apart rows of transverse slots extending transversely across said floor member, said plurality of rows of transverse slots being separate from each other and including a front row of transverse slots and a plurality of rear rows of transverse slots, said front row of transverse slots being positioned between said landing zone and said front roller section, said plurality of rear rows of transverse slots being positioned and located between and separating adjacent roller sections, each row of transverse slots being formed by a plurality of spaced apart rib members and each slot having a front portion and a back portion;

the rib members forming said front row of transverse slots including a ridge extending respectively transversely completely across the back portion of each slot, the rib members forming said plurality of rear rows of transverse slots each including a projection;

a plurality of L-shaped hooks extending from one side portion of said floor member and a plurality of gaps positioned and located on an opposite side portion thereof, said plurality of L-shaped hooks and said plurality of gaps being positioned and located to be cooperatively engageable in a side-by-side relationship with another floor member;

wherein said upward extending slots associated with said front product bumper, said ridges associated with said front row of transverse slots, and said projections associated with said plurality of rear rows of transverse slots aid in engaging and releasably receiving any plurality of a divider member to said floor member for forming any plurality of product channels therebetween.

2. The floor member of claim 1 including at least one removably attachable divider member having a front portion and a rear portion, said divider member including a front tab having a front edge portion and a rear edge portion, the rear edge portion of said front tab having node associated therewith, and a plurality of rear tabs, each rear tab including a recess, the front portion of said divider member being selectively engageable with any one of said upward extending slots associated with said front product bumper, the node of said front tab being selectively engageable with any one of the ridges associated with said front row of transverse slots, and each recess of each of said rear tabs being selectively engageable with any one of the projections associated with each of said rear rows of transverse slots.

3. The floor member of claim 1 including at least one removably attachable divider member having a front portion and a rear portion, said divider member including a front tab having a front edge portion and a rear edge portion, the rear edge portion of said first tab having a node associated therewith, and a plurality of rear tabs, each rear tab including a hole, the front portion of said divider member being selectively engageable with any one of said upward extending slots associated with said front product bumper, the node of said front tab being selectively engageable with any one of the ridges associated with said front row of transverse slots, and each hole of each of said rear tabs being selectively engageable with any one of the projections associated with each of said rear rows of transverse slots.

4. The floor member of claim 1 including a front wall member, said front wall member including a plurality of flange members extending downward therefrom forming slits therebetween, said front wall member further including an overhanging lip portion extending transversely across its front portion, said front product bumper further including at least two cavities formed by divider means positioned and located therebetween and the end walls of said front product bumper, said front product bumper further including a U-shaped channel, at least some of the flange members associated with said front wall member being engageable with the cavities of said front product bumper and at least some of said slits of the front wall member being receivable by said divider means, and the overhanging lip portion of said front wall member and the U-shaped channel of said front product bumper forming a graphic channel therebetween when the front wall member and front product bumper are selectively engaged with one another.

5. The floor member of claim 1 including a floor extension member having at least one row of rear transverse slots, said floor extension member further including at least one group of finger members comprising two outer fingers and an inner finger positioned therebetween, said outer fingers being positioned and located for selective engagement with outer receivers positioned and located at the rear portion of said floor member, and said inner finger being positioned and located for selective engagement with an inner receiver positioned and located at the rear portion of said floor member and between said outer receivers.

6. The floor member of claim 5 wherein said floor member includes a rounded lip extending downward from the rear terminal end portion thereof, and wherein said floor extension member further includes a wedge member, said wedge member including at least one projection member, said at least one projection member abutting said rounded lip when said floor extension member is selectively engaged with said floor member.

7. The floor member of claim 5 wherein said outer receivers each include a rib portion separating said outer receiver into front and rear apertures, each of said outer fingers including a space, said space mating with the rib portion of a respective outer receiver when said floor extension member is selectively engaged with said floor member.

8. The floor member of claim 5 wherein said inner receiver includes a ledge, and wherein said inner finger includes a barb, said barb engaging said ledge when said floor extension member is selectively engaged with said floor member.

9. The floor member of claim 5 wherein said floor extension member further includes at least one pair of outer receivers and at least one inner receiver positioned therebetween along its rear end portion, said out receivers being positioned and located for selective engagement with the outer fringes of another floor extension member, and said inner receiver being positioned and located for selective engagement with the inner finger of another floor extension member.

10. The floor member of claim 1 wherein the outermost rib members located at the opposed side portions of said front row of transverse slots each include a ridge portion and wherein the outmost rib member located at one of the opposed side portions of each of said plurality of rear rows of transverse slots includes a projection, and wherein when said floor member is selectively engaged in side-by-side relationship with another floor member, the outmost rib members of said front row of transverse slots of the adjacent floor members form a slot therebetween which includes a ridge extending substantially between the formed slot, and the outmost rib members of the plurality of rear rows of transverse slots of the adjacent floor members form a slot including a projection.

11. The floor member of claim 10 further including a divider member, said divider member including a front tab having a node associated therewith and a plurality of rear tabs, each rear tab including a recess, the node of said front tab being selectively engageable with the ridge formed between the outermost rib members of the front row of transverse slots of the adjacent floor members, and each recess of each of said rear tabs of said divider member being selectively engageable with the projection located between the outermost rib members of said plurality of rear rows of transverse slots of the adjacent floor members.

12. The floor member of claim 10 further including a divider member, said divider member including a front tab having a node associated therewith and a plurality of rear tabs, each rear tab including a hole, the node of said front tab being selectively engageable with the ridge formed between the outermost rib members of the front row of transverse slots of the adjacent floor members, and each hole of each of said rear tabs of said divider member being selectively engageable with the projection located between the outermost rib members of said plurality of rear rows of transverse slots of the adjacent floor members.

13. The floor member of claim 2 wherein said divider member further includes a C-shaped channel portion for engaging said divider member to the rear portion of said floor member.

14. The floor member of claim 13 wherein said divider member includes a rear product stop bumper, said C-shaped channel portion being associated with said rear product stop bumper.

15. The floor member of claim 3 wherein said divider member further includes a C-shaped channel portion for engaging said divider member to the rear portion of said floor member.

16. The floor member of claim 15 wherein said divider member includes a rear product stop bumper, said C-shaped channel portion being associated with said rear product stop bumper.

17. The floor member of claim 1 wherein each of said L-shaped hooks includes a space formed by said hook which mates with a floor portion located above each of said plurality of gaps when another floor member is selectively engaged with said floor member in a side-by-side relationship.

18. The floor member of claim 17 wherein at least one of said L-shaped hooks includes a barb, and wherein at least one of said gaps includes a ledge associated with the floor member structure forming said gap, said barb engaging said ledge when another member is selectively engaged with said floor member in a side-by-side relationship.

19. The floor member of claim 4 wherein said front wall member includes a generally curved profile such that products traveling down said floor member first make contact with the top portion of said front wall member, said top portion functioning as a momentum arrestor to decrease the likelihood of a forward-most product from toppling over said front wall member.

20. The floor member of claim 4 wherein said front wall member includes an angled profile such that products traveling down said floor member first make contact with the top portion of said front wall member, said top portion functioning as a momentum arrestor to decrease the likelihood of a forward-most product from topping over said front wall member.

21. The floor member of claim 19 wherein the top portion of said front wall member includes a beaded portion, said beaded portion being positioned and located so as to contact a forward-most product positioned on said floor member.

22. The floor member of claim 20 wherein the top portion of said front wall member includes a beaded portion, said beaded portion being positioned and located so as to contact a forward-most product positioned on said floor member.

* * * * *